(12) United States Patent
Brown et al.

(10) Patent No.: US 11,916,162 B2
(45) Date of Patent: Feb. 27, 2024

(54) INFRARED LIGHT EMITTERS BASED ON INTERBAND TUNNELING IN UNIPOLAR DOPED N-TYPE TUNNELING STRUCTURES

(71) Applicant: Wright State University, Dayton, OH (US)

(72) Inventors: Elliott R. Brown, Beavercreek, OH (US); Weidong Zhang, Cary, NC (US); Tyler Growden, Dublin, OH (US); Paul Berger, Columbus, OH (US)

(73) Assignee: Wright State University, Dayton, OH (US)

( * ) Notice: Subject to any disclaimer, the term of this patent is extended or adjusted under 35 U.S.C. 154(b) by 577 days.

(21) Appl. No.: 17/083,286

(22) Filed: Oct. 28, 2020

(65) Prior Publication Data

US 2022/0020896 A1 Jan. 20, 2022

Related U.S. Application Data

(60) Provisional application No. 62/927,013, filed on Oct. 28, 2019.

(51) Int. Cl.
| | | |
|---|---|---|
| *H01S 5/34* | (2006.01) | |
| *B82Y 20/00* | (2011.01) | |
| *H01L 33/00* | (2010.01) | |
| *H01L 33/06* | (2010.01) | |
| *H01S 5/30* | (2006.01) | |

(Continued)

(52) U.S. Cl.
CPC .......... *H01L 33/0025* (2013.01); *B82Y 20/00* (2013.01); *H01L 33/0029* (2013.01); *H01L 33/06* (2013.01); *H01S 5/3095* (2013.01); *H01S 5/34313* (2013.01); *H01S 5/347* (2013.01);

(Continued)

(58) Field of Classification Search
CPC . H01L 33/0025; H01L 33/0029; H01L 33/06; H01L 27/15; H01L 33/305; H01L 33/30; B82Y 20/00; H01S 5/3095; H01S 5/34313; H01S 5/347; H01S 5/0657;

(Continued)

(56) References Cited

U.S. PATENT DOCUMENTS

2002/0063858 A1* 5/2002 Patterson .............. G01S 7/4814
356/28
2007/0134002 A1* 6/2007 Arahira ..................... G04F 5/14
398/155

(Continued)

OTHER PUBLICATIONS

S. G. Muttlak et al., "InGaAs/AlAs Resonant Tunneling Diodes for THz Applications: An Experimental Investigation," in IEEE Journal of the Electron Devices Society, vol. 6, pp. 254-262, 2018 (Year: 2018).*

(Continued)

*Primary Examiner* — Xinning(Tom) Niu
(74) *Attorney, Agent, or Firm* — McNees Wallace & Nurick LLC

(57) ABSTRACT

A unipolar-doped light emitting diode or laser diode is described. The diode includes a bottom region having an n-type layer, a top region having an n-type layer, and a middle region between the top and bottom regions having at least one material different from the top or bottom region forming two or more heterojunctions. The top and bottom regions create light emission by interband tunneling-induced photon emission. Systems including the unipolar-doped diode including LIDAR are also taught.

19 Claims, 19 Drawing Sheets

(51) Int. Cl.
*H01S 5/343* (2006.01)
*H01S 5/347* (2006.01)
*G01S 7/481* (2006.01)
*H01L 27/15* (2006.01)
*H01S 5/065* (2006.01)
*H04N 5/33* (2023.01)

(52) U.S. Cl.
CPC .............. *G01S 7/4815* (2013.01); *H01L 27/15* (2013.01); *H01S 5/0657* (2013.01); *H04N 5/33* (2013.01)

(58) Field of Classification Search
CPC .. H01S 5/06216; H01S 5/0658; H01S 5/3402; G01S 7/4815; G01S 7/484; H04N 5/33
See application file for complete search history.

(56) References Cited

U.S. PATENT DOCUMENTS

| | | | |
|---|---|---|---|
| 2013/0121362 A1* | 5/2013 | Kub | H01S 3/083 372/50.22 |
| 2016/0352072 A1* | 12/2016 | Belkin | H01S 5/3401 |
| 2017/0040769 A1* | 2/2017 | Hashimoto | H01S 5/0261 |
| 2019/0027644 A1* | 1/2019 | Brown | H01S 5/34333 |

OTHER PUBLICATIONS

S. Barbieri et al., "Design strategies for GaAs-based unipolar lasers: Optimum injector-active region coupling via resonant tunneling", Appl. Phys. Lett. 78, 282-284 (2001) (Year: 2001).*

* cited by examiner

INFRARED LIGHT EMITTERS BASED ON INTERBAND TUNNELING IN UNIPOLAR DOPED N-TYPE TUNNELING STRUCTURES

PRIORITY CLAIM AND CROSS-REFERENCE TO RELATED APPLICATIONS

This application claims the benefit of U.S. Provisional Patent Application Ser. No. 62/927,013 entitled NEW INFRARED LIGHT EMITTERS BASED ON INTERBAND TUNNELING IN UNIPOLAR DOPED N-TYPE TUNNELING STRUCTURES filed on Oct. 28, 2019, the entirety of which application is incorporated by reference herein.

ORIGIN OF THE INVENTION

This invention was made with government support under 1848865 awarded by National Science Foundation. The government has certain rights in the invention.

TECHNICAL FIELD

The present innovation relates generally to n-type doped III-V and II-V semiconductor-based, light-emitting devices and their heterostructures, and, more particularly to the generation of holes and radiative recombination between the generated holes and internal electrons that naturally occur in in the n-type materials. Because of their lack of p-type doping, as is required in conventional p-n diode light emitters, there are distinct advantages to the new approach, including higher internal quantum efficiency, higher speed and greater modulation bandwidth independent of their use as light-emitting diodes or laser diodes. And by tailoring the use of different base semiconductor materials, such as InGaAs, InAs, InSb, and HgCdTe, a wide range of wavelengths can be emitted from short-wave to long-wave infrared (SWIR to LWIR), covering a wavelength range of approximately 1.6 to 10 micron. The innovation also provides for novel electro-optic functionality by fabricating the light emitters with embedded resonant-tunneling diode (RTD) structures, utilizing the inherent fast electrical negative differential resistance that RTDs naturally provide.

BACKGROUND

Since the announcement of the first strong semiconductor-based p-n light emitting diodes (LEDs) and laser diodes (LDs) in the 1960s, the interest in LEDs for lighting applications has grown steadily, and the commercial applications have expanded to the extent that LEDs are a huge industry, changing the world from one lit by traditional incandescent and fluorescent light bulbs, to one lit by LEDs tailored to emission in the human-visible spectrum. The key step forward has been the development of heterostructures—multiple-quantum-well (MQW) structures in particular, for improving the internal quantum efficiency of otherwise normal (homojunction) p-n diodes. MQW p-n diodes have also driven the development of LDs having enough power for many system applications, including free-space and fiber-based optical communications, and light detection and ranging (LIDAR) systems. In certain wavelength regions from roughly the blue visible region (wavelength ~450 nm) to the SWIR (wavelength ~1.5 micron), both MQW LEDs and LDs perform close to theoretical limits of internal quantum efficiency, so much of the attention in their research and development has gone towards improving their external quantum efficiency through various techniques of optical coupling, which are manifold. However, one problem persists, which is the poor transport of the holes in practically all of the semiconductors used in these structures. This leads to a phenomena called current "droop", whereby not all of the quantum wells in these structures are populated with sufficient holes for efficient cross-gap radiative recombination. The forward bias current then increases faster than the light emission, causing a reduction in the internal quantum efficiency, and hence the "droop."

This scenario gets worse when light emission is sought for the in the SWIR to LWIR range. Conventional p-n diode lasers must then be fabricated from narrow band-gap semiconductors whose band gap energy must decrease as the operational wavelength increases. This introduces a multitude of problems, many of them related to the p-type doping. Because the fundamental electrical transport properties of holes is far inferior to that of electrons, p-type doped devices introduce resistive losses in contacts and undepleted regions. Because they must be operated in forward bias, there is always a relatively large device capacitance compared to n-type unipolar devices, usually associated with minority-carrier diffusion capacitance. And these occur on top of the fact that the narrow band-gap of these materials invites excessive carrier generation (electrons and holes) by impact ionization, which is an unstable effect that is inherently noisy and can easily lead to premature device failure from thermal runaway. Hence, as a rule-of-thumb, as the wavelength increases between ~1 and 10 micron, there is an increasing need to cryogenically cool the LEDs or LDs down to 77 K or less to achieve useful quantum efficiency and reliability. This was the trend for several decades prior to the 1990s, and was never overcome until the advent of n-type unipolar-doped light-emitter devices.

The first successful unipolar-doped light-emitting device was the quantum-cascade laser (QCL), which not only eliminated the need for cryogenic cooling but also provided wavelength-tuning by electrical means. QCLs are based on sequential (or cascade) intraband tunneling of electrons through multi-barrier superlattice-like structures that have been under development since the 1970s. Holes are not involved in the excitation or emission process, making them relatively free of current "droop" and diffusion capacitance. Today QCLs are the first choice in the MWIR-to-LWIR range and have been adopted for a growing variety of system applications. However, QCLs are very complicated to fabricate, requiring the most precise form of molecular-beam epitaxy available and very long (hours) growth times, which renders a high production cost that essentially precludes their use as LEDs, even though those are possible in principle.

However, there is another way to construct unipolar-doped light emitters other than QCLs. It is by creating the holes necessary for cross-gap radiative recombination by interband (Zener) tunneling within the active region of a n-type semiconductor heterostructure. Like impact ionization, interband tunneling is very sensitive to the band-gap energy of the semiconductor used. However, with careful design, the interband tunneling can be made much more probable than impact ionization such that it dominates the hole generation rate. And through judicious design with heterostructure barriers and quantum wells, the generated holes can be designed to drift electron-rich regions of the structure, such as the accumulation region on the emitter side of a double-barrier resonant-tunneling diode structure, where efficient cross-gap electron-hole radiative recombination occurs. And unlike QCLs, the heterostructures required are relatively simple without any cascading, entailing at most a few barriers and quantum wells with lower required growth precision such that OMCVD may be considered as the epitaxial growth technique in lieu of MBE. Historically and into the foreseeable future, OMCVD has been the epitaxial growth technique of choice in semiconductor-device production, especially for "consumer electronic" devices like LEDs.

SUMMARY OF THE INVENTION

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

According to an aspect, the innovation provides viable hole generation for radiative cross-gap recombination with electrically injected electrons. This eliminates the need for a p-n junction altogether and provides for efficient hole generation by interband (Zener) tunneling of electrons. The radiative recombination with electrons can take place either in a quantum well if there are two or more barriers, or in the accumulation regions for electrons and holes on the emitter side of the structure (recombination zone).

According to an aspect, the innovation comprises a valence-to-conduction interband electron tunneling diode, comprising: a substrate; an n-type bottom contact; a radiative recombination zone that could be a single layer, a single quantum well or a series of multi-quantum wells; a bottom spacer; an electron barrier, either single or multiple barrier; an interband-tunneling hole generator which creates a large concentration of holes on the emitter side; a top spacer separating the tunneling region from the ohmic contact; and an n-doped top contact layer.

In one embodiment, the structures according to the innovation can generate a high conduction-band electron current density through design of the heterobarriers and doping profiles. They can also generate a high density of holes. Without being bound by theory, the generation of high density holes may be principally by Zener tunneling of electrons, but possibly also by impact ionization of valence-band states in the presence of energetic conduction-band electrons. Because the electron and hole currents and densities are created by fundamentally different physical mechanisms, they can in principle be balanced. This is an important consideration for efficient operation of any light emitter, be it an LED or LD.

In one example embodiment of the innovation, resonant-tunneling conduction-band electron current densities of order $1 \times 10^4$ A/cm$^2$, and Zener tunneling densities of order $10^2$ A/cm$^2$ have already been achieved in the baseline device (See FIGS. 2, 9 and 10). In one embodiment, the electron current density could be decreased to match the Zener tunneling (or impact ionization) density, thereby enabling a much more efficient LED or LD. In another embodiment, a device according to the innovation could increase the Zener tunneling current to match the electron conduction-band current, but this is more challenging. If the Zener tunneling were to increase significantly, say by one order-of-magnitude, the structure according to the innovation could be used as a hole generator in conjunction with other device structures requiring holes in certain regions but electrons in others. This would allow for the elimination of a p-type contact.

According to an aspect, the innovation provides a solid-state device comprising a bottom n-type layer; a top n-type layer; a middle layer inserted between the top layer and bottom layer. The middle layer may include at least two materials provided between the top and bottom layers which serve as heterojunction tunnel barriers. The top layer and the middle layer form an interband tunnel barrier to generate holes by Zener tunneling across the potential barrier of the forbidden energy gap, and where the middle layer forms at least one intraband tunnel barrier to control electron flow.

In one embodiment, the invention includes a device wherein the top, middle and bottom layers are comprised of gallium indium arsenide, mercury cadmium telluride, indium aluminum antimide, or alloys and combinations of II-V, and/or II-VI semiconductors.

According to an aspect, the innovation provides a light emitting diode comprising a bottom n-type layer; a top n-type layer; a middle layer inserted between the top layer and the bottom layer. The middle layer may comprise at least two materials provided between the top and bottom layers which serve as heterojunction tunnel barriers. In one embodiment, the top, middle and bottom layers are independently selected from gallium indium arsenide, mercury cadmium telluride, indium aluminum antimide, or alloys and combinations of semiconductors.

The middle layer forms an interband tunnel barrier to generate holes by Zener tunneling across the potential barrier of the forbidden energy gap, and where the middle layer forms a least one intraband tunnel barrier to control electron flow. The radiative recombination of Zener injected holes from the top layer occurs directly with electrons electrically injected from the bottom layer.

In one embodiment, p-type doping is not part of the active device.

According to an aspect, the innovation provides a laser diode comprising a bottom n-type layer; a top n-type layer; a middle layer inserted between the top layer and bottom layer, where the middle layer comprises at least two materials provided between the top and bottom layers which serve as heterojunction tunnel barriers. The top layer and the middle layer form an interband tunnel barrier to generate holes by Zener tunneling across the potential barrier of the forbidden energy gap. In addition, the middle layers form at least one intraband tunnel barrier to control electron flow and wherein the radiative recombination of Zener injected holes from the top layer occurs directly with electrons electrically injected from the bottom layer. A Fabry-Perot etalon is added external to the radiative recombination zone to form a laser diode.

According to an aspect, the innovation provides hole generation for radiative cross-gap recombination with electrons in an n-type unipolar doped structure. This eliminates the need for a p-n junction altogether and provides for sufficient hole generation by interband tunneling of electrons. The radiative recombination with electrons can take place either in a quantum well if there are two or more barriers, or in the accumulation (electron rich) region for electrons on the emitter side of the n-type structure. However, in this aspect the holes are generated on the opposite side of the tunnel barriers as the electron rich region, so there is a loss in efficiency because the holes have to tunnel through barriers to reach this region.

In another aspect presented for the first time in this application, the holes can be generated on the same side as the electron-rich region, eliminating the problem of holes tunneling through barriers to participate in the cross-bandgap radiative recombination. This new concept is called tunneling induced photon emission (TIPE).

In additional aspects, both aspects above are applied to unipolar-doped TIPE light emission structures. The wavelength of emission of the light emission structures may be between 1.0 to 12 microns. Both light emitting diodes (LEDs) and laser diodes (LDs) may be operated in the three common bands comprising the infrared (IR) region of the electromagnetic spectrum: (1) short-wave IR (SWIR); 1.0-2.5 micron wavelength; (2) mid-wave IR (MWIR), 3.0-5.0 micron wavelength; and (3) long-wave IR (LWIR), 8.0-12.0 micron wavelength. Emission in the SWIR region occurs in $In_XGa_{1-X}As/Al_YGa_{1-Y}As$ unipolar doped interband tunneling structures. Emission in the MWIR occurs in $In_XGa_{1-X}As/Al_YGa_{1-Y}Sb$ unipolar doped structures, or in $In_XGa_{1-X}Sb/Al_YGa_{1-Y}Sb$ structures. And emission in the LWIR occurs in $Hg_XCd_{1-X}Te/Hg_YCd_{1-Y}Te$ system with X>>Y. In all cases, the devices can be designed to promote interband tunneling, and therefore, hole generation, over electron intraband tunneling and other electron transport mechanisms, thereby providing for high internal quantum efficiency. One notorious electron transport mechanism, which also creates holes is impact ionization which, like interband tunneling, creates holes in abundance. And it increases with decreasing band gap of the particular semiconductor, so it increases in going from the InGaAs- to HgCdTe-based materials systems described above. And the present application is the first known utilization of these materials as unipolar n-type TIPE light emitters, following decades of pursuit using these materials in conventional p-n junction emitters.

In another aspect of the invention, the unipolar-doped interband-tunneling light emitters include an embedded intraband resonant tunneling diode (RTD) which provides an inherent negative differential resistance (NDR), capable of supporting fast switching or radio frequency oscillations. These occur in addition to the TIPE light-emission mechanism, providing for new device functionality.

For example, in one embodiment the fast switching of the RTD through its inherent NDR is utilized to make a transmission-line radio frequency relaxation oscillator. When combined with the light emission of the same RTD, an optical-clock function is realized which can be useful in a number of infrared system applications. When the RTD is coupled optically as an LED, the optical clocking acts as internal modulator for use in an infrared illuminator, which is very useful for infrared imaging. When the RTD is coupled optically as an LD, the optical clocking acts as a precise pulse timer in an infrared (SWIR, MWIR and LWIR) light-detection and ranging (LIDAR) system, where the precision of the timer and the associated low pulse-to-pulse jitter is very important for target range determination and target identification under conditions such as rain and fog, and in environments with foliage. When the relaxation oscillator repetition frequency is matched to the longitudinal-mode frequency separation of an external optical cavity, the relaxation oscillator serves as a fast "shutter" for realizing an optical mode-locked laser. In return, the optical transition contributes "absorption loss", which further reduces the phase noise (or timing jitter) of the radio frequency pulses in the transmission relaxation oscillator. This is essentially a dual mode-locking using the same RTD-LD emitter as "active medium" with one mode-locked process for the infrared radiation in the optical cavity, and the other for the radio frequency radiation in the transmission-line resonator.

DETAILED DESCRIPTION OF THE INVENTION

Figure 1:
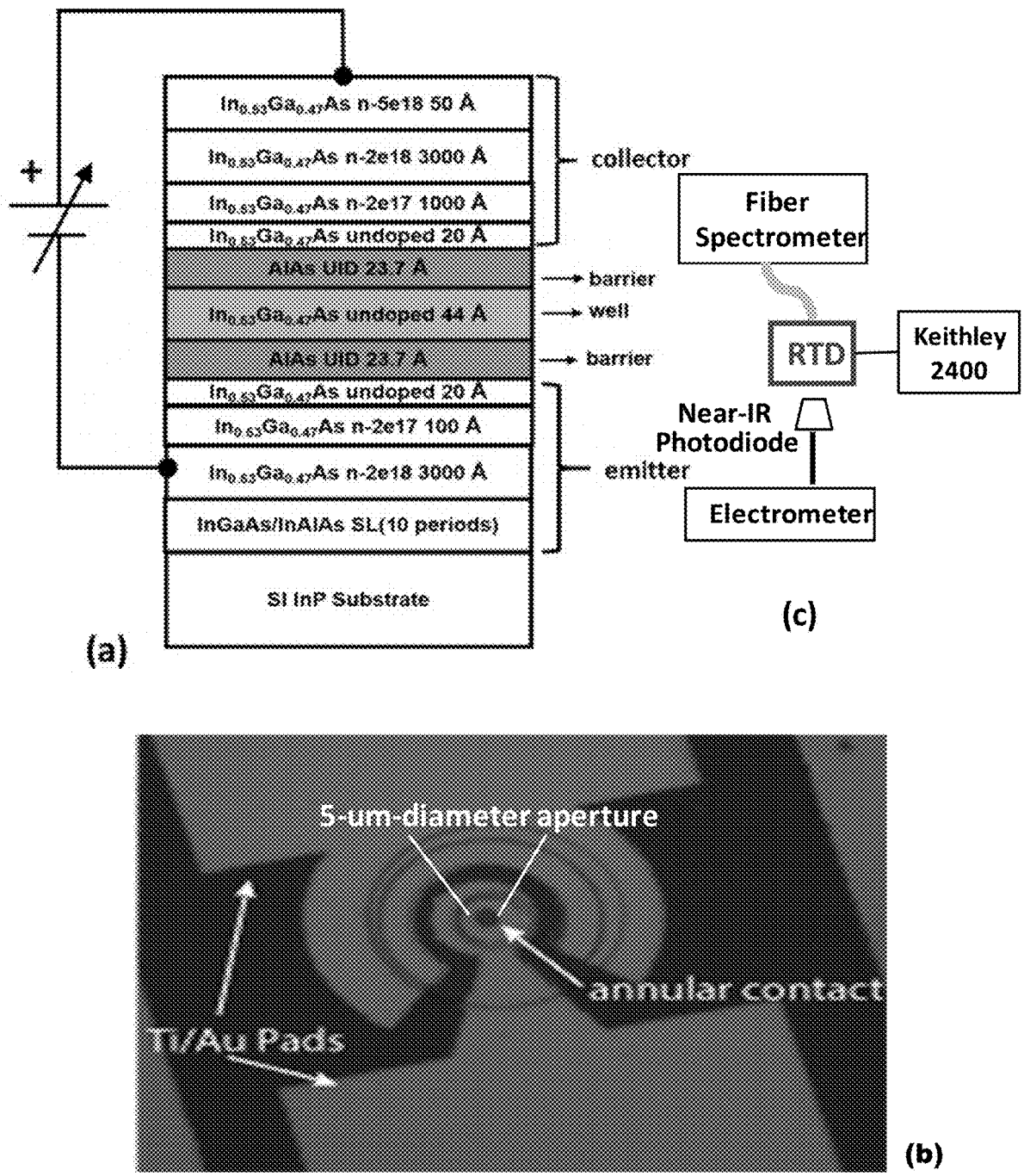
FIG. 1 depicts in panels (a), (b) and (c) an epitaxial-layer structure and an experimental setup, according to an embodiment.

Referring to FIG. 1, the drawing shows (a) Epitaxial layer structure for InGaAs/AlAs RTD. (b) Experimental set-up used to measure I-V curves, total light emission, and spectrally resolved light emission.

Figure 2:
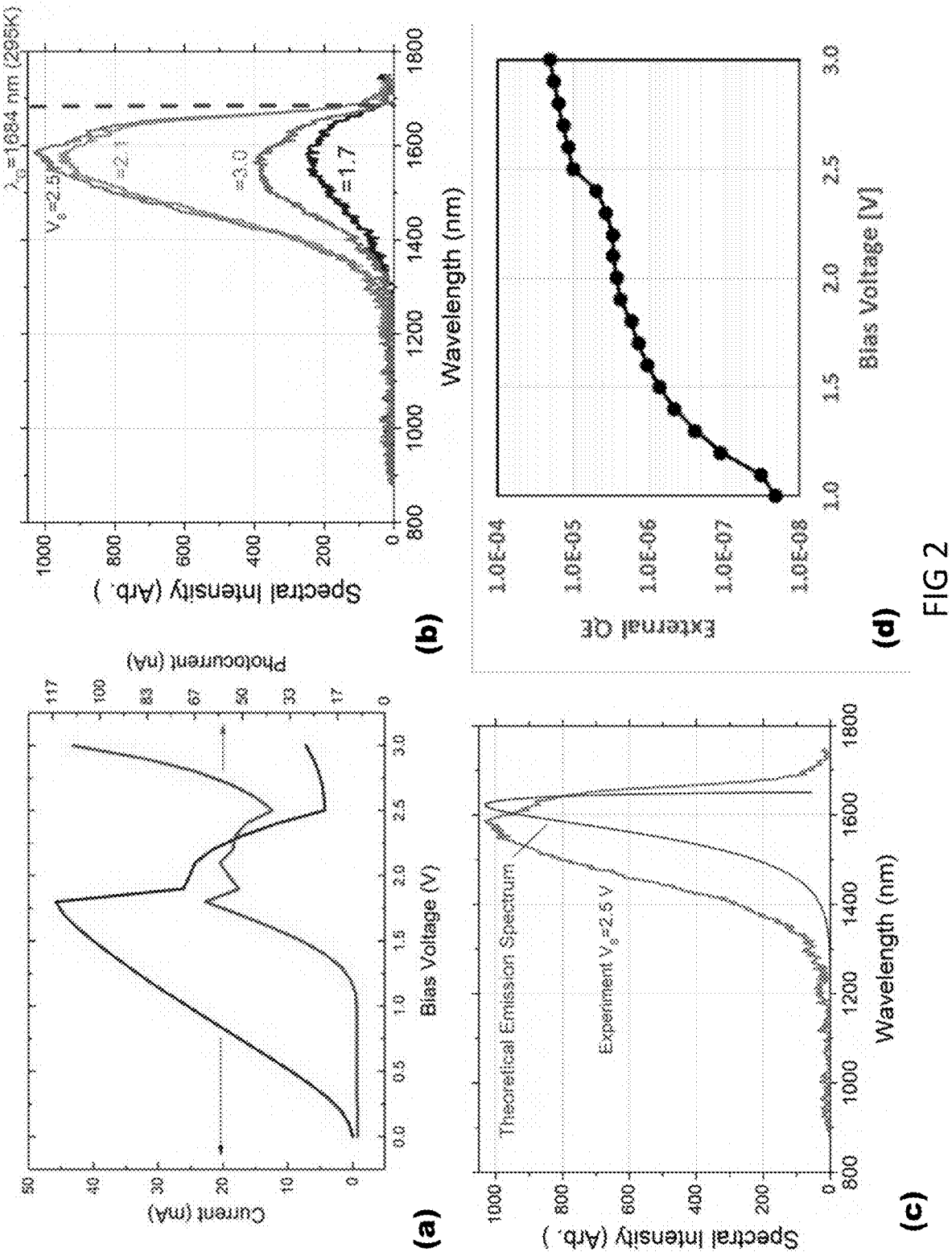
FIG. 2 presents in panels (a), (b), (c) and (d) graphical data including I-V curve, photocurrent curve, spectrally resolved emission, emission at 2.5V, and quantum efficiency for a device according to an embodiment.

Referring to FIG. 2, the drawing shows (a) Room-temperature I-V curve (left vertical axis), and photocurrent curve (right vertical axis) measured with the NIR Ge photodiode of FIG. 1, panel (b). (b) Spectrally resolved emission at four different bias voltages. (c) Spectral emission at 2.5-V bias in (b) and the plot of theoretical electro-luminescence according to Eqn. 1. (d) Experimental external quantum efficiency measured with the set-up in FIG. 1, panel (b).

Figure 3:
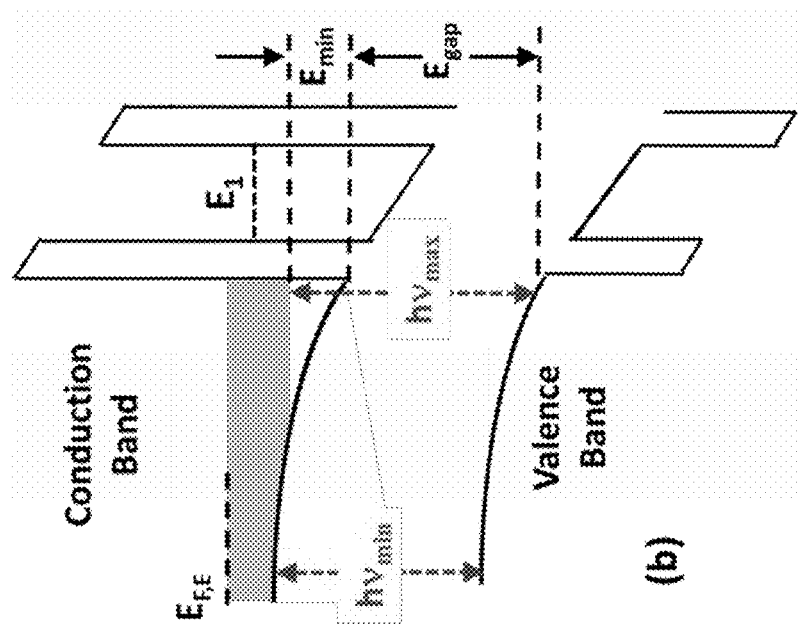
FIG. 3 illustrates in panels (a) and (b) band bending with positive bias, electron resonant- and interband-tunneling, and emission energy.
Figure 3:
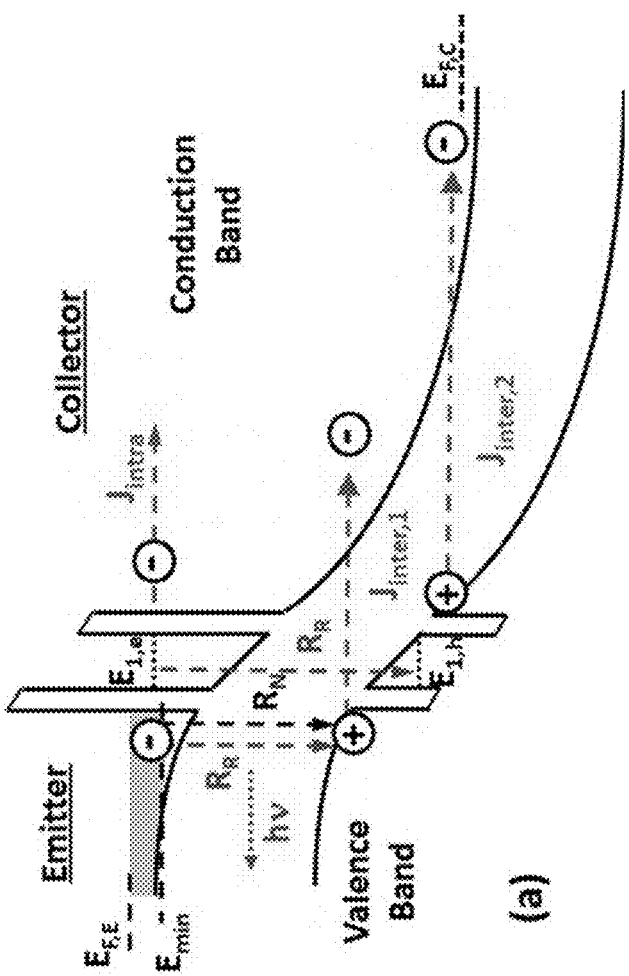

Referring to FIG. 3, the drawing shows (a) Band bending model with positive bias applied to the collector side showing simultaneous electron resonant- and interband-tunneling. Holes can be created by interband tunneling originating from either the collector or emitter side. (b). A zoom-in on the emitter side of (a) showing how the electron-hole photon emission energy can be greater than the band-gap because of the quantum-size effect in the accumulation region next to the first heterojunction.

Figure 4:
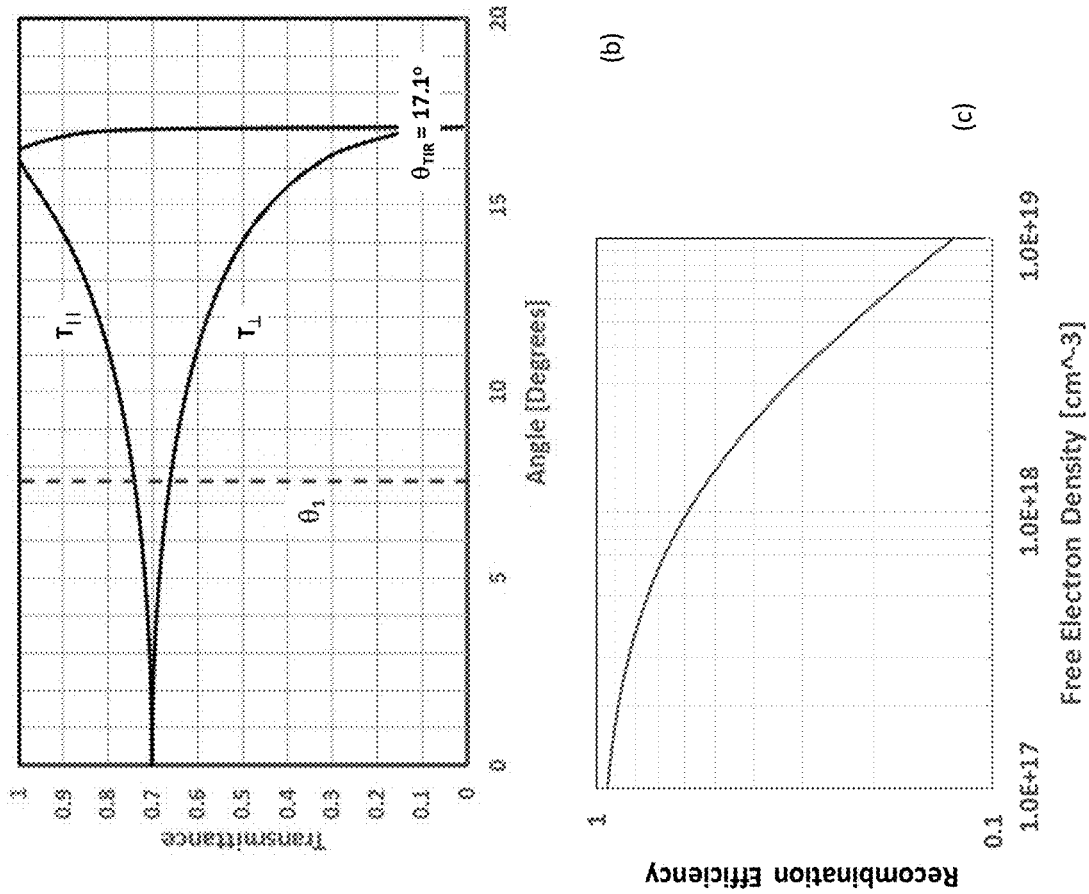
FIG. 4 illustrates in panels (a), (b), and (c) a ray diagram, power transmittance, and recombination efficiency for a device according to an embodiment.
Figure 4:
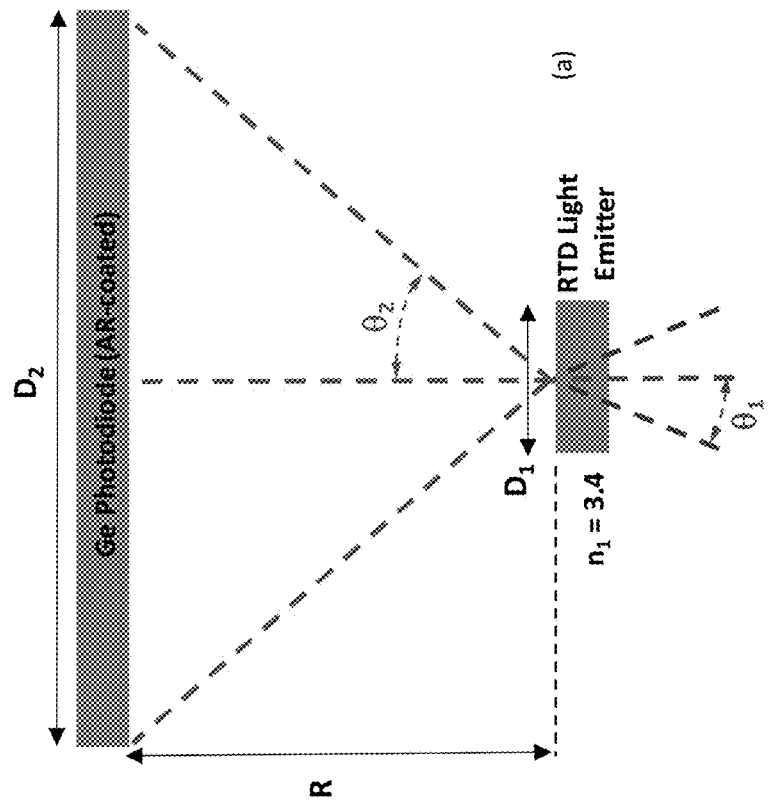

Referring to FIG. 4, the drawing shows (a) Ray diagram for light emanating from the RTD chip and refracting into free space above it toward the photodiode. (b) power transmittance into free space according to the Fresnel equations and assuming n=3.4. (a) and (b) are used to estimate the optical collection efficiency for the experimental set-up. (c) Recombination efficiency for In0.53Ga0.47As vs. free electron density assuming electron-electron-hole Auger scattering is the dominant non-radiative mechanism.

Figure 5:
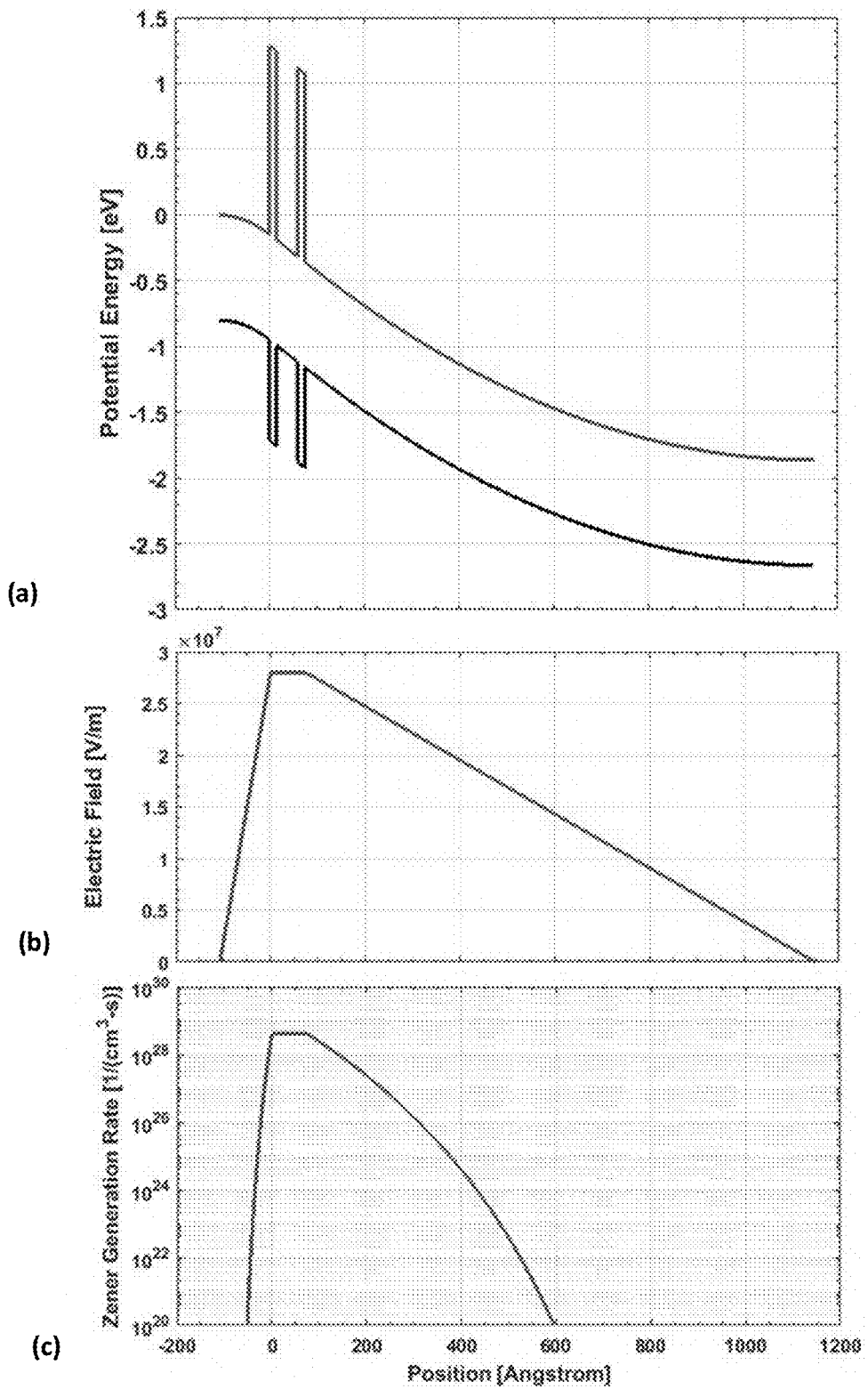
FIG. 5 illustrates in panels (a), (b), and (c) a band bending diagram, electric field, and local hole penetration rate for a device according to an embodiment.

Referring to FIG. 5, the drawing shows (a) Band bending diagram of the double-barrier In0.53Ga0.47As/AlAs double-barrier RTD structure according to the model described in the text. (b) Internal electric field for the band bending in (a). (c) Local hole generation rate for the electric field in (b) and parameters described in the text.

Figure 6:
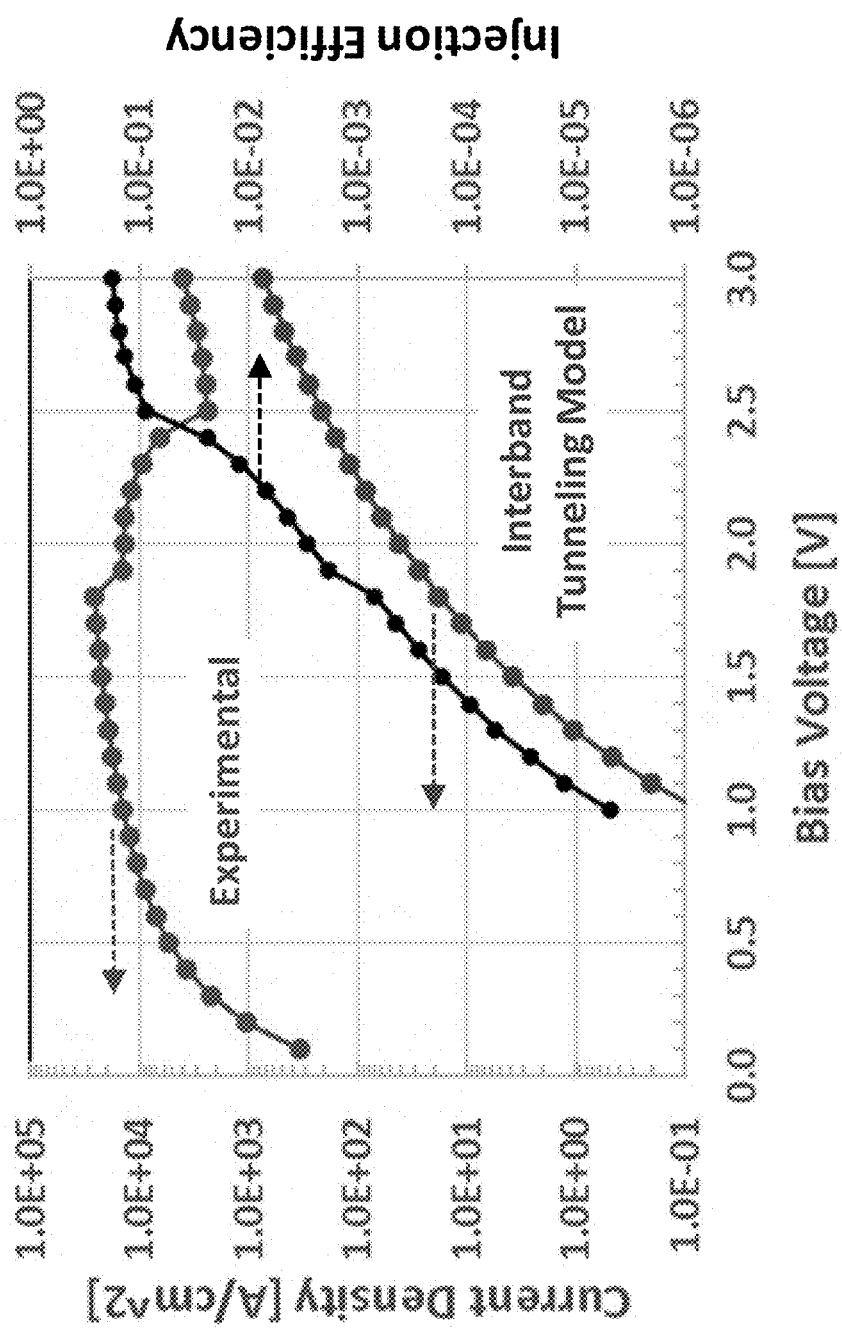
FIG. 6 illustrates electrical current-density and model interband current density to calculate injection efficiency, for a device according to an embodiment.

Referring to FIG. 6, the drawing shows (a) Total electrical current density and model interband current density (left vertical axis). Electrical injection efficiency calculated as the ratio of the two curves in (a).

Figure 7:
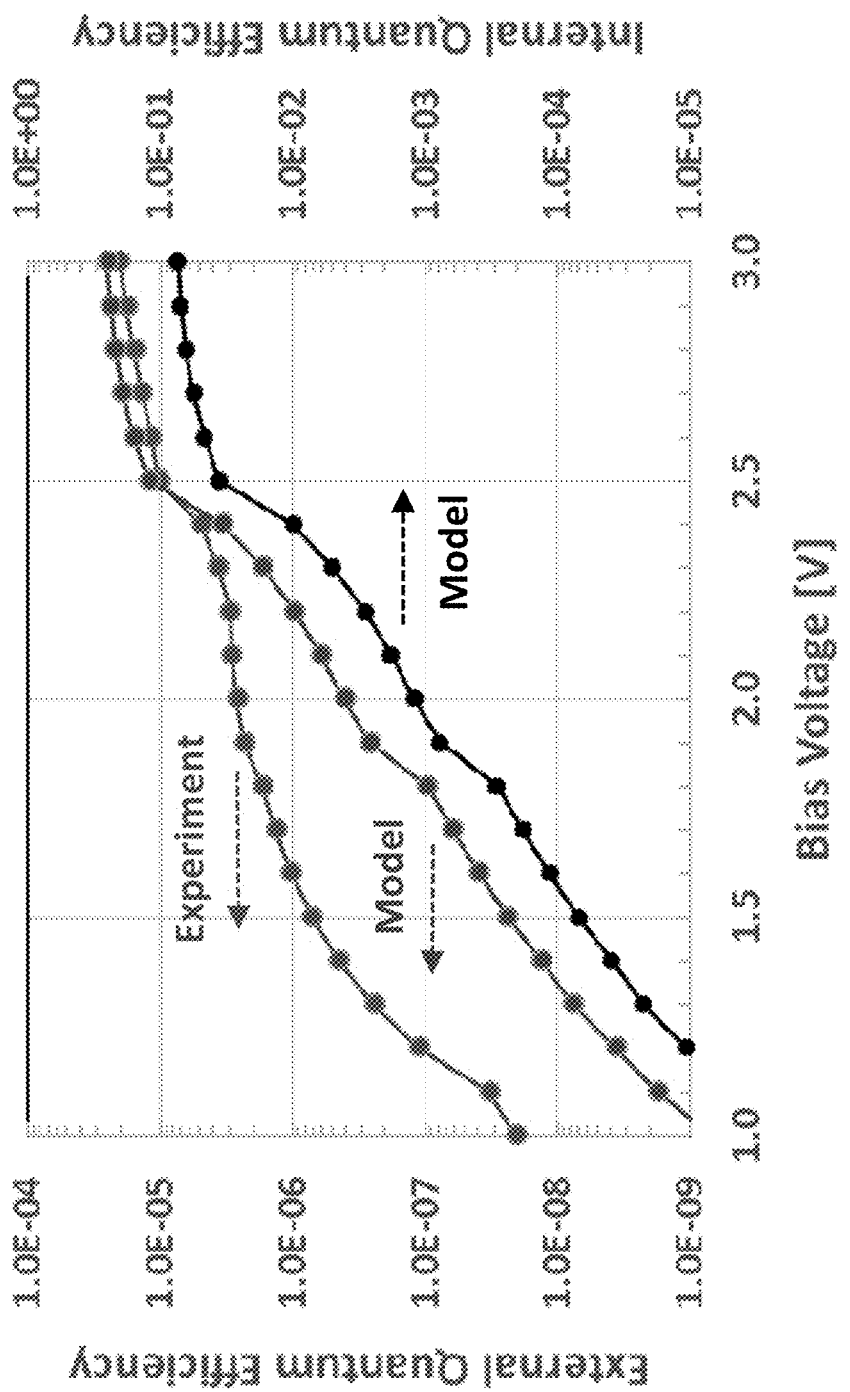
FIG. 7 compares experimental and model quantum efficiencies for a device according to an embodiment.

Referring to FIG. 7, the drawing shows Comparison of experimental and model external quantum efficiency (left vertical axis). Model prediction for internal quantum efficiency (right vertical axis).

Figure 8:
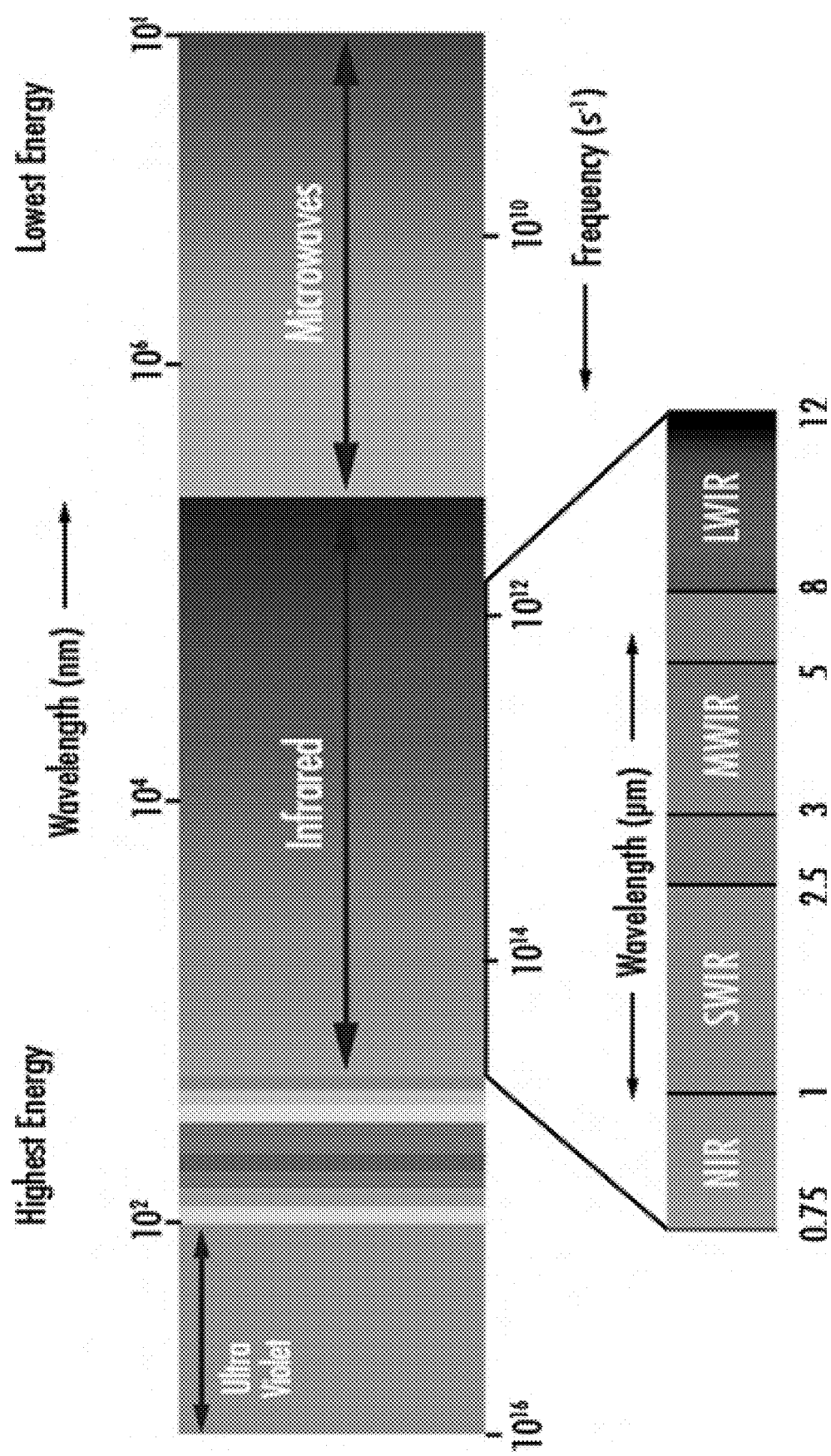
FIG. 8 illustrates the wavelengths associated with infrared radiation bands.

Referring to FIG. 8, the drawing shows Common infrared radiation bands

Figure 9:
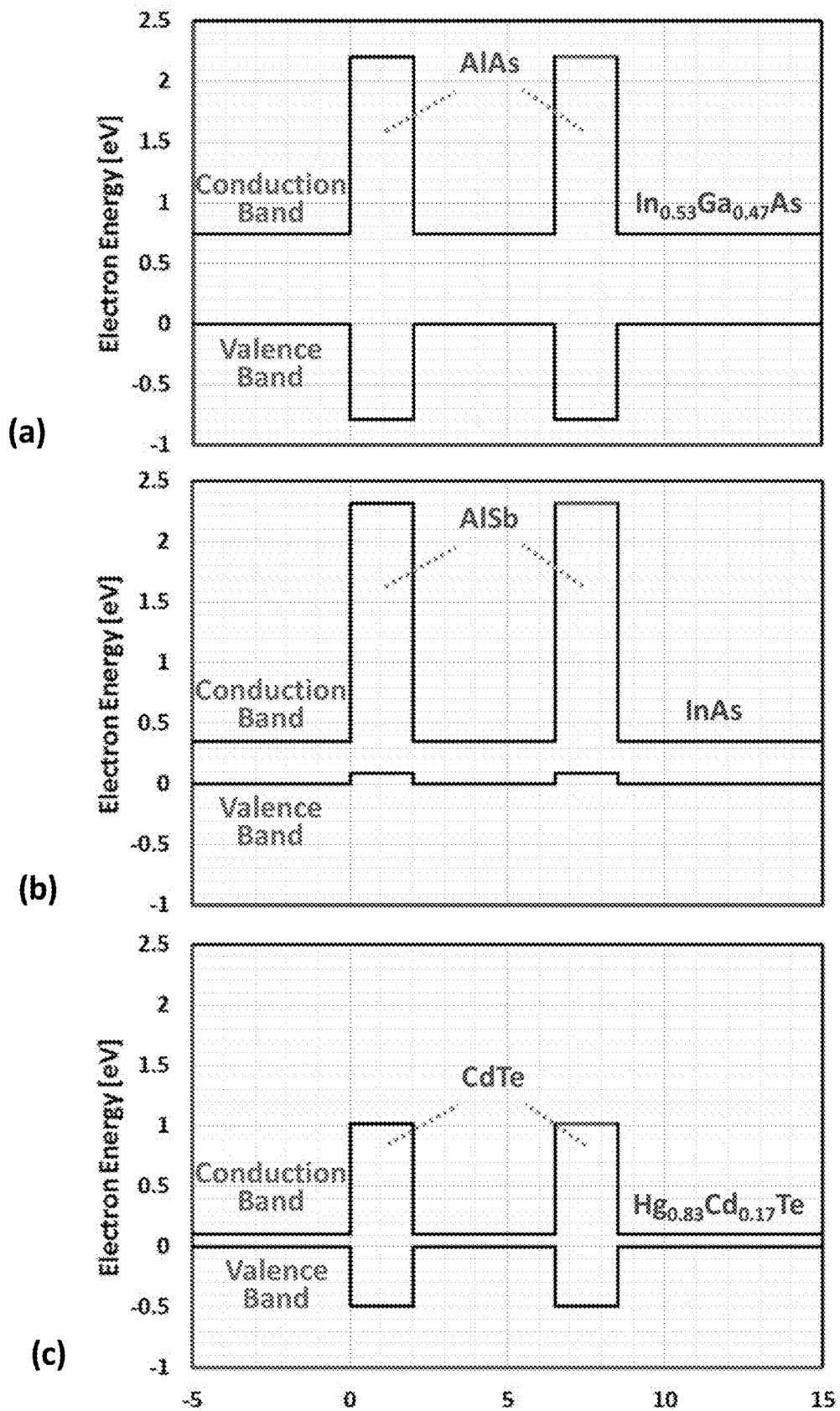
FIG. 9 describes in panels (a), (b) and (c) valence-conduction band offsets, according to an embodiment.

Referring to FIG. 9, the drawing shows Valence-to-conduction band offsets for double-barrier structures in three material systems that can simultaneously create NDR via resonant tunneling, and electron-hole radiative recombination via interband tunneling: (a) In0.53Ga0.47As/AlAs double-barrier structure for emission in the SWIR region; (b) InAs/AlSb double-barrier structure for emission in the MWIR region; (c) Hg0.83Cd0.17Te/CdTe double-barrier structure for emission in the LWIR region.

Figure 10:
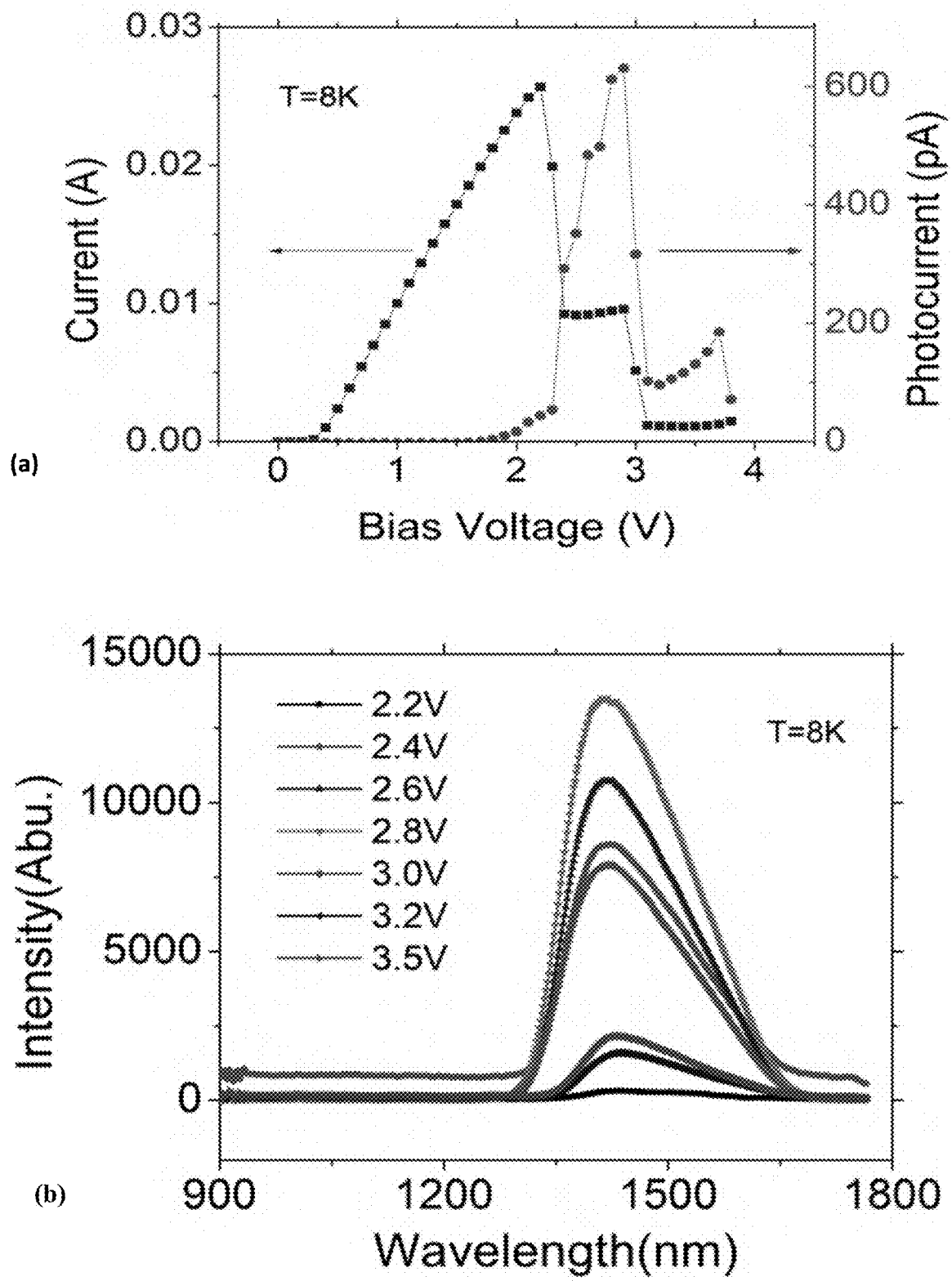
FIG. 10 illustrates in panels (a) and (b) the I-V and L-V curves for a device according to an embodiment.

Referring to FIG. 10, the drawing shows (a) The I-V and LV curve at T=8 K for an InGaAs RTD. (b) The spectrum for discrete bias voltages at 8 K.

Figure 11:
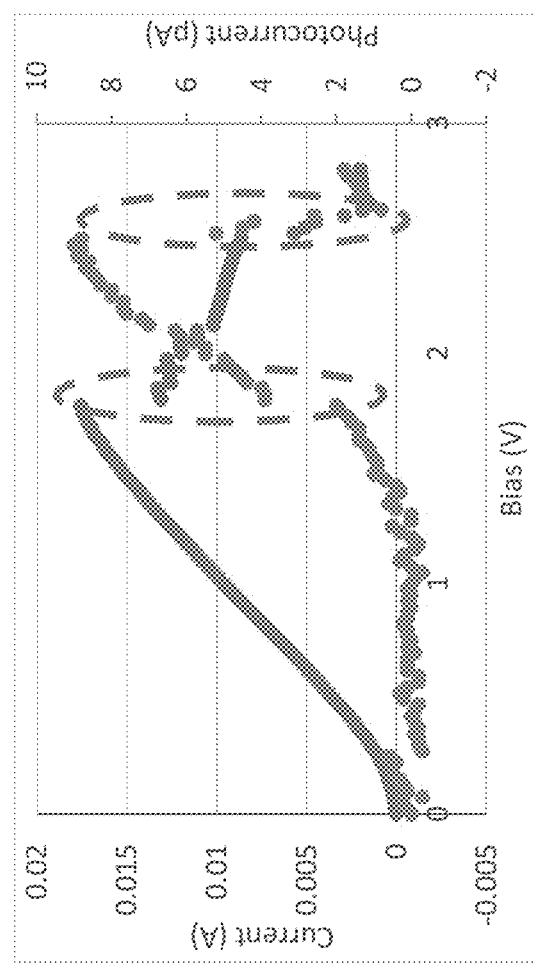
FIG. 11 illustrates in panels (a) and (b) the I-V and L-V curves for a device according to an embodiment.

Referring to FIG. 11, the drawing shows The I-V (blue) and L-V (orange) curve at T=300 K for an InGaAs RTD.

Figure 12:
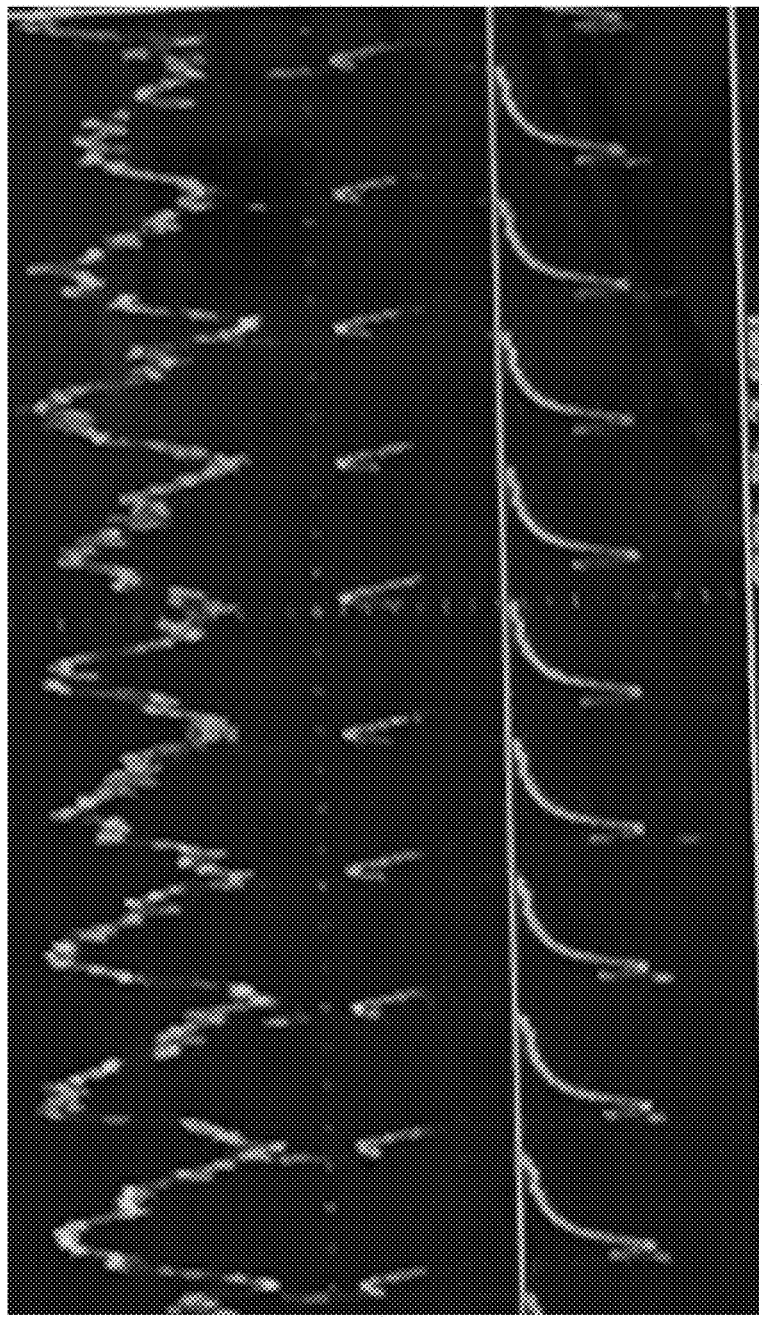
FIG. 12 illustrates the RF and EL self-oscillations due to the negative-differential resistance for a device according to an embodiment.

Referring to FIG. 12, the drawing shows The RF and EL self-oscillations. The blue color represents the self-oscillation caused by the NDR, and the yellow color is the self-oscillation of photoemission.

Figure 13:
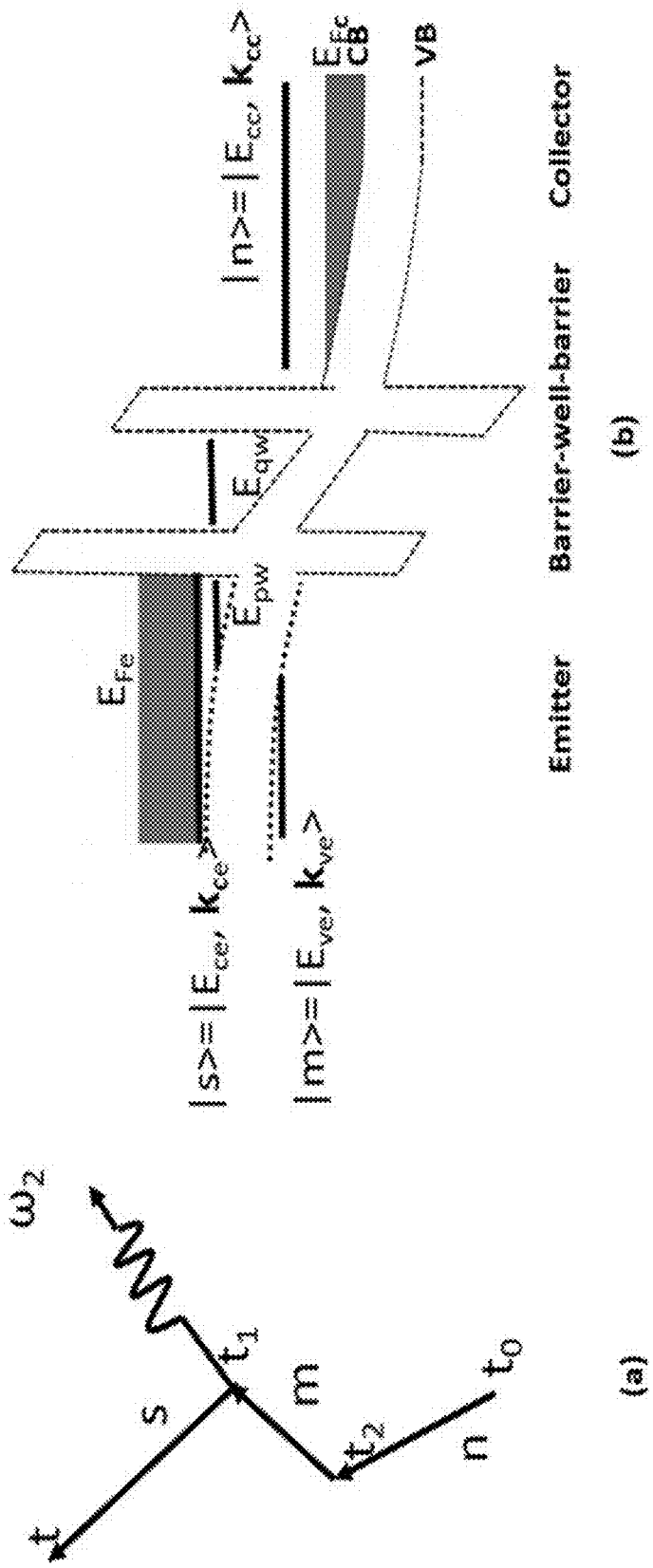
FIG. 13 illustrates in panels (a) and (b) the Feymann diagram and definition of states, according to an embodiment.

Referring to FIG. 13, the drawing shows (a) The Feynman diagram, and (b) the definition of the states |n>, |m> and |s>.

Figure 14:
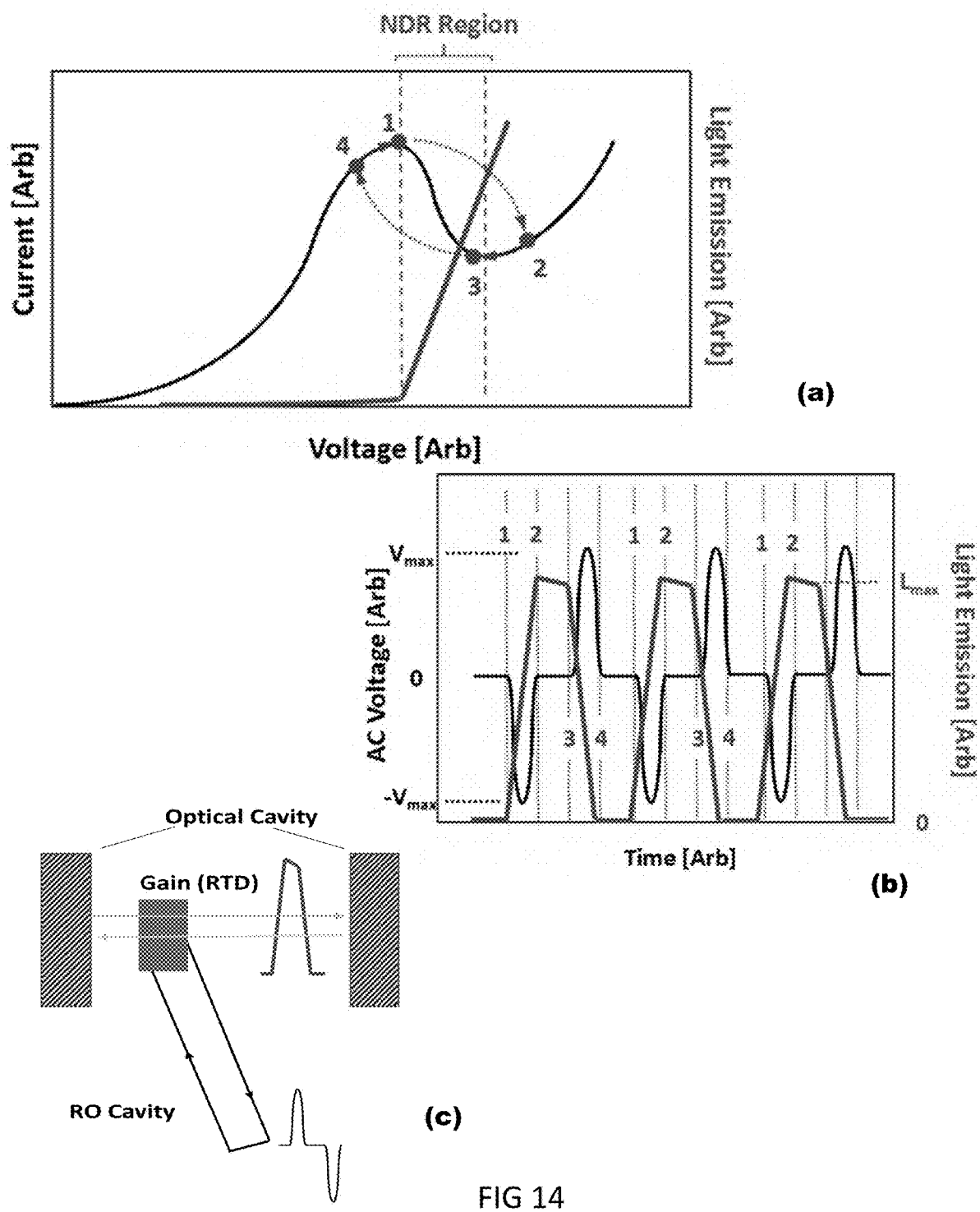
FIG. 14 illustrates in panels (a), (b) and (c) the I-V, L-V curves and oscillation waveforms for a device according to an embodiment.

Referring to FIG. 14, the drawing shows (a) The same RTD I-V curve as in 5(b) superimposed with the L-V curve assuming that the threshold voltage of the light emission is at or near the peak voltage of the RTD NDR region. (b) Same RTD relaxation oscillator waveform as in FIG. 4, panel (c) superimposed with the corresponding light emission waveform, resembling an ideal optical clock. (c) The coupling of optical cavity and relaxation oscillation cavity for dual mode locking. The voltage pulses created by the relaxation oscillation of RTDs is functioned as a "shutter". And the annihilation of carriers by the optical transition would likely create "absorption losses" in the voltage pulses of the relaxation oscillation.

I. Overview

In research a few years ago on n-type unipolar GaN/AlN RTDs, near-ultraviolet (UV) electroluminescence (EL) was discovered in addition to reproducible negative differential resistance (NDR) at room temperature. Through spectral measurements, the UV emission was found to be centered at the GaN band-gap (~3.44 eV) wavelength around 365 nm, and the emission was also spectrally pure, absent of lower "yellow" emission. And through recent noise measurements, the injected carrier transport displayed normal shot noise, except for an expected suppression effect at biases associated with resonant tunneling. These results, combined with detailed quantum transport computations, suggested that the near-UV emission was by cross-gap radiative recombination between electrons accumulated on the emitter side of the device, and holes created in the same region by interband Zener tunneling, which is enabled in vertical GaN heterostructures by the large polarization fields (~5×10$^6$ V/cm) at the RTD GaN/AlN heterointerfaces. That discovery and physical interpretation was the subject of U.S. Pat. No. 10,461,216.

Meanwhile, cross-gap electroluminescence has long been studied in n-type unipolar doped GaAs/AlGaAs RTDs starting with a first report in 1991, and a similar demonstration shortly thereafter. More recently, and partly because of revived interest in RTDs as high frequency oscillator and high-speed switches, more recent electroluminescence results have been reported in GaAs/AlGaAs RTDs, and a potential on-off optoelectronic switching application proposed. However, all of these studies of GaAs/AlGaAs RTDs were carried out at cryogenic temperatures (e.g., 10 K) and none of them reported on the quantum efficiency of the electroluminescence, neither the internal or external values, both of which matter critically in assessing the use of electroluminescent mechanisms in practical optoelectronic or photonic devices. Furthermore, they all attributed the electroluminescence to hole generation by impact ionization without consideration of interband tunneling. In this Application we propose that interband tunneling must play a key role in creating a significant population of holes on the emitter side of the RTD structure, which then create photons by radiative electron-hole recombination. We then apply it to a variety of new RTD material systems chosen to produce light emission in the popular infrared emission bands, SWIR, MWIR, and LWIR, as described in more detail below in this document.

To justify our approach to new IR light emitters based on RTD tunnel structures, we start by presenting our first experimental observation and modeling of band-gap, room-temperature electroluminescence in a $In_{0.53}Ga_{0.47}As$/AlAs double-barrier RTD just short of the $In_{0.53}Ga_{0.47}As$ band-gap wavelength around λ=1580 nm. This suggests that the resonant- and interband-co-tunneling of electrons may be a universal feature of unipolar double-barrier RTDs and, remarkably, one that has not been reported in the vast literature of resonant-tunneling diodes over the past 40$^+$ years. And it contradicts the widespread belief that interband tunneling in type-I heterostructures, such as $In_{0.53}Ga_{0.47}As$/AlAs, is a negligible effect because it is weaker than in type-II heterostructures. Furthermore, it could support new device applications exploiting the intrinsic negative differential resistance of RTDs along with the new light emission capability, occurring over the same range of bias voltage, and with the emission wavelength occurring in the technologically-relevant 1550-nm region. Such applications will be described later in this document.

II. InGaAs/AlAs RTD Materials and Methods

II.A. Material Growth

The double-barrier RTD device under test was grown by molecular beam epitaxy (MBE) as an $In_{0.53}Ga_{0.47}As/AlAs$ heterostructure on a semi-insulating InP substrate with a layer structure and doping profile as shown in FIG. 1, panel (a). Its active region is comprised of two unintentionally doped (UID) AlAs barriers (thickness=2.4 nm) separated by an undoped $In_{0.53}Ga_{0.47}As/AlAs$ quantum-well (width=4.4 nm) layer, such that a quasibound level, $E_1$, occurs in the quantum well at an energy of ≈0.23 eV above the $In_{0.53}Ga_{0.47}As/AlAs$ conduction band edge under zero bias. This rather high confinement energy compared to typical double-barrier RTDs means that a large bias is required to reach the condition of negative differential resistance (NDR), especially under forward bias (positive on top contact), because of the 100-nm low-doped spacer layer on the top side that depletes and supports a large voltage drop and electric field.

The double-barrier RTD devices were fabricated using a 5-level mask set consisting of the following steps: (i) top contact/mesa definition, (ii) bottom contact definition, (iii) device isolation, (iv) via creation, and (v) RF pad definition. The top and bottom ohmic contacts were annular in shape and formed with a Ge/Au based stack, while the RF pads were Ti/Au. The isolation was done with a patterned PECVD-SiO$_2$ top layer, and the via holes were dry-etched with a CF$_4$ plasma. Several different diameter mesas were fabricated, but only 15-micron-diam devices are addressed here. To allow for vertical light emission, a 5-micron-diameter circular hole was opened up in the center of the top contact using the same microfabrication techniques as described above. A top-view micro-photograph of the device structure is shown in FIG. 1, panel (b). In some aspects of the invention a plurality of RTD devices may be fabricated on a substrate. The devices may be monolithically integrated on the substrate. One or more devices may be formed on a substrate in combination with other types of devices to form a monolithically integrated device or chip.

II-B. Experimental Set-Up

For device characterization, the set-up shown in FIG. 1, panel (c) was used, consisting of a precision I-V probe station, a near-IR light-emission detector, and a near-IR fiber spectrometer. The ambient temperature was ≈295 K. The detector was a large-area (3-mm diam) Ge photodiode with spectral response between 800 and 1800 nm, and having a peak responsivity of $\Re$ ≈0.85 A/W at a wavelength of 1550 nm. It was optically coupled through free space with the photodiode located as close-as-possible (≈3 mm, limited by packaging issues) to the double-barrier RTD. Its output was dc coupled to a solid-state electrometer having a current noise floor of ~1 pA. The fiber spectrometer was a room-temperature InGaAs-array-grating instrument [i] sensitive between 880 and 1750 nm and having a programmable spectral resolution, chosen for the present experiments to be 0.5 nm.

III. Experimental Results and Spectral Interpretation

The I-V curve for a 15-μm-diam device is plotted in FIG. 2, panel (a). It displays a pronounced NDR region with a peak in current of 45.8 mA at 1.8 V, and a valley of 4.3 mA at 2.5 V, corresponding to a peak-to-valley current ratio (PVCR) of 10.6. This excellent PVCR is characteristic of InGaAs vs GaAs-based double-barrier RTDs going back to their first demonstrations. The maximum voltage applied to the device was 3.0 V since above this value other devices from the same test wafer failed. Another important device metric is the peak current density $J_P$ which is $2.6 \times 10^4$ A/cm$^2$ in this 15-μm-diam active-area device, qualifying it for moderately fast electrical switching amongst other possible high-speed applications, such as optoelectronic integrated circuits (OEICs).

Shown in FIG. 2, panel (a) (right vertical axis) is the photocurrent $I_P$ from the 3-mm-diam Ge photodiode as a function of RTD bias voltage, i.e., the electroluminescence (EL) curve, as measured by an electrometer having ~100 pA noise floor. Hence, the low-bias value of photocurrent shown in FIG. 2, panel (a) is the photodiode dark current of ≈9.7 nA. The photocurrent waveform rises significantly above the dark current at a bias voltage of ≈1.2 V, and increases monotonically with higher voltage up to the NDR region, where it levels off. Then there is a slight drop down to the valley point followed by a rapid increase with bias beyond the valley. As described further below in the modeling section, this rapid increase is consistent with light emission emanating by radiative recombination of electrons on the emitter side with holes created by interband (Zener) tunneling into the high-field region of the device.

Shown in FIG. 2, panel (b) are the EL spectral emission curves plotted vs. wavelength and parameterized by bias voltage at $V_B$=1.7, 2.1, 2.5, and 3.0 V. The middle two bias points are in the NDR region, and the first and last points are just below and above it, respectively. All four curves show a peak emission $\lambda$ around 1580 nm, and a long-wavelength cut-off behavior around 1650 nm. Superimposed in FIG. 2, panel (b) is the $In_{0.53}Ga_{0.47}As$ band-edge wavelength reference, $\lambda$=1684 nm corresponding to the band-gap energy of 0.736 eV at 295 K, and calculated with the Varshni formula. The intersection of this reference line with all four spectral curves in their steeply rising edge suggests that the observed emission is occurring at or near the $In_{0.5}Ga_{0.47}As$ band edge. However, the strongest curves in the NDR region (i. e., $V_B$=2.1, 2.5 V) are distinctly asymmetric with short-wavelength tails that extend to 1300 nm, or less. In addition, the weaker emission curve below the NDR region (i.e. $V_B$=1.7) also displays short-wavelength tails, but appear more symmetric. The light emission was also measured with a UV-VIS spectrometer, but no significant emission feature was observed in the wavelength range of 200-800 nm.

To further support the cross-gap emission interpretation, FIG. 2, panel (c) shows the brightest of the emission curves plotted against the ideal spontaneous emission expression for a bulk semiconductor EL [i]:

$$S(v) = H \cdot v^2 (hv - E_G)^{1/2} \exp[(E_G - hv)/k_B T] \quad (1)$$

where $E_G$ is the $In_{0.53}Ga_{0.47}As$ band gap [0.735 eV at 295 K], H is a frequency-independent constant, and no external cavity effects are included. The agreement is satisfactory on the low frequency (long-wavelength) end, but clearly Eqn. 1 decays much faster than the experimental data on the short-wavelength side. The experimental short-wavelength emission is possibly the result of a quantum size effect in the "pre-well" on the emitter side, as will be described further below.

Given the peaked nature of the emission spectra around 1580 nm, and knowing that the Ge photodiode displays its peak responsivity near this wavelength, we can convert the $I_P$-V curve of FIG. 2, panel (a) into a plot of external quantum efficiency $\eta_{ext}$ for the set-up of FIG. 1, panel (b).

We first subtract the dark current from $I_P$ in FIG. 2, panel (a), and utilize the general expression $$\eta_{ext} = e \cdot I_P / (\mathfrak{R} \cdot I_E \cdot h\nu) \quad (2)$$

where $I_E$ is the electrical current through the device at each bias voltage, $h\nu=0.79$ eV is the 1580-nm photon energy, and $\mathfrak{R} \approx 0.85$ A/W. The plot of $\eta_{ext}$ is displayed in FIG. 2, panel (d), starting at 1.0 V where the photodiode current exceeds its dark current by more than the RMS fluctuation. $\eta_{ext}$ increases monotonically with bias voltage by approximately 3 orders-of-magnitude between 1.0 V and the maximum bias of 3.0 V. And although even the highest measured $\eta_{ext}$ is only $\approx 2 \times 10^{-5}$, this can be explained largely by a low optical out-coupling efficiency in our set-up of FIG. 1, panel (b), as described further below.

IV. Modeling

It is well known and reviewed below that the external quantum efficiency of an EL device (the p-n LED being the paradigm) emitting by the cross-gap radiative recombination of electrons and holes in a semiconductor can be expressed as the product of three separate quantities, $$\eta_{ext} = \eta_C \cdot \eta_E \cdot \eta_R \equiv \eta_C \cdot \eta_{int} \quad (3)$$

Here $\eta_C$ is the optical coupling efficiency between the internal emission and the external detector, $\eta_E$ is the electrical injection efficiency (the fraction of the total electrical current that contributes free carries which radiatively recombine), and $\eta_R$ is the radiative recombination efficiency (the fraction of the electron and hole combined currents that create photons). The last step combines $\eta_E$ and $\eta_r$ into an "internal" quantum efficiency $\eta_{int}$, which represents a limit on how high $\eta_{ext}$ can get given perfect optical coupling. To estimate these three quantities, we need a model for the RTD EL device and then compare the predictions against the experimental $\eta_{ext}$ plotted in FIG. 2, panel (d) to test for self-consistency. We need to be careful about certain aspects of the model since the RTD-EL device is a unipolar-n-type-doped structure, unlike the p-n-junction-based LEDs that dominate the EL-device world.

Our model is as shown in FIG. 3, panel (a) with the assumed electrical current mechanisms and recombination mechanisms as well. The first and predominant current mechanism should be the traditional electron intraband current that occurs between the emitter and collector sides via elastic resonant tunneling through a "quasibound" level in the quantum well between the two barriers. There are other intraband current components, such as inelastic, phonon-mediated tunneling through the barriers, and these contribute significant current, especially beyond the valley voltage of the RTD. In FIG. 3, panel (a) all of the intraband tunneling electron current components are represented by $J_{intra}$ (electrons per unit area per unit time) and the quasibound level by $E_1$.

The second and crucial current mechanism is interband tunneling by an electron between an occupied state in the valence band and an unoccupied state in the conduction band. This Zener tunneling can occur in the structure if the internal electric field to bend the bands is high enough, as will be analyzed below. When an electron undergoes interband tunneling, it leaves behind a hole in the valence band either on the emitter or the collector side, depending on where the valence-band bound electron originates from [the two possibilities are represented by $J_{inter,1}$ and $J_{inter,2}$ in FIG. 3, panel (a)]. This hole naturally tends to drift "uphill" (leftward) in the energy diagram of FIG. 3 in the electric field created by the bias voltage. And given enough hole density, they will tend to diffuse in that direction too. If created on the collector side, once they reach the double-barrier structure they can tunnel through the thin barriers either elastically by resonant tunneling, or inelastically. The tunneling probability of holes through AlAs barriers (embedded in $In_{0.53}Ga_{0.47}As$) should be greater than that of electrons through the same barriers. This is because the barrier height seen by holes is ~0.4 eV compared to ~1.3 eV for electrons.

Being a minority carrier, once the holes reach the emitter side there are recombination processes possible with the large density of electrons there. The two shown in FIG. 3 are the radiative recombination between a free electron and the hole, represented by the transition rate $R_R$ (number of electron-hole pairs per second per unit volume) in FIG. 3. This is the desired rate that creates photons at or just above the band gap energy, i.e., $h\nu \geq E_G$. However, there are non-radiative transitions too, collectively represented by the transition rate $R_N$ shown in FIG. 3, and discussed further below.

The model is consistent with all of the experimental evidence obtained to date. It predicts photon emission at the band-edge energy (or somewhat higher) and occurring on the emitter side of the structure, consistent with FIGS. 2, panels (b) and (c). It predicts that the necessary holes for radiative recombination on the emitter side originate from a mechanism—interband tunneling—that is known to be strongly dependent on internal electric field, and therefore bias voltage across the structure. This is consistent with the rapidly increasing $\eta_{ext}$ plotted in FIG. 2, panel (d). It is also consistent, qualitatively, with the experimental spectrum of FIG. 2, panel (c) being skewed toward shorter wavelengths than the ideal cross-gap spontaneous emission curve. This is because the "pre-well" region on the emitter side should display some degree of spatial quantization (quasi-2DEG) because of the abruptness of the heterojunction and because it is undoped (or low-doped) over 12 nm. This will in turn create a minimum energy in this region relative to the conduction-band edge, and thus a larger effective band-gap and photon emission energy [$h\nu_{max}$ in FIG. 3, panel (b)] than the normal bandgap and photon energy [$h\nu_{min}$ in FIG. 3, panel (b)].

Our goal in this first analysis is not to evaluate all of these aspects of the model quantitatively, as some of them are quite complicated. Rather, we will evaluate only the essential aspects necessary to estimate $\eta_C$, $\eta_E$, $\eta_R$, and $\eta_{int}$, and therefore produce a credible comparison to the experimental $\eta_{ext}$.

IV-A. Optical Coupling Efficiency

Although our electronic RTD device is not designed to have efficient optical coupling, it is configured with respect to the external detector in a simple enough way [FIG. 1, panel (b)] to make a reasonable estimate of $\eta_C$ given our model of light emission. A cross-sectional view of the light coupling is shown in FIG. 4, panel (a). The RTD is oriented with its top facet [the top interface in FIG. 1, panel (a)] parallel to the large-area Ge photodiode, which is located a distance R away. The RTD emitter has an open aperture of 5-micron diameter defined by the annular top-metal (ohmic) contact described above. This leads to an estimate of the maximum subtense angle (with respect to the normal) of $\theta_2$=a tan[$D_2$/2R] of the detector with respect to the RTD. The corresponding angle in the RTD emitter $\theta_1$ is reduced by optical refraction (Snell's law), such that $\theta_1 \approx$a sin{sin [a tan($D_2$/2R)]/$n_1$}, where $n_1 \approx$3.4 is the refractive index of In$_{0.53}$Ga$_{0.47}$As around $\lambda$=1550 nm. This will be the maximum internal angle of emission in the RTD collected by the detector provided it is less than the angle of total internal reflection $\theta_{TIR} \approx$a sin(1/$n_1$)=17.1°. Substitution of $D_2$=3 mm and R=3 mm yields $\theta_1$=a sin {sin[a tan($D_2$/2R)]/$n_1$}7.6° (0.13 rad), well under the critical angle. The last step is the one commonly made in cross-gap spontaneous luminescence in 3D semiconductors, which is that the internal radiation is isotropic. We can then estimate the light available for collection by the angular detector $f_\Omega=\Omega_1/4\pi$, where $$\Omega_1 = 2\pi \int_0^{\theta_1} \sin\theta \cdot d\theta = 2\pi(1-\cos\theta_1) = 0.55 \text{ sr},$$

so that $f_\Omega$0.0043. To obtain a credible estimate of $\eta_C$, we also need to include the effects of optical aperture and internal reflection from the top semiconductor-air interface. The optical aperture, $A_O$, in the present device is the 5-micron diameter opening in the top contact, compared to the full mesa diameter of 15-micron. According to our model, the device can support interband tunneling, and hence photon emission, over the full mesa area $A_E$. Hence the effect on the optical coupling efficiency is a second, aperture factor, $f_A=A_O/A_E=(5/15)^2=1/9$. Finally, and transmission through the top InGaAs/air interface can be estimated by a transmission factor, $f_T$ which is the transmittance averaged over angle (0 to $\theta_1$) and polarization (perpendicular and parallel to the internal plane of incidence). As calculated below for our specific optical configuration, and assuming that n=3.4, we find $f_T$=0.70. This is the approximate normal-incidence transmittance of 0.70 because from 0 to 01 the rate of increase of $T_\parallel$ is nearly the same as the rate of decrease of $T_\perp$, as shown in FIG. 4, panel (b). And it leads to a total optical coupling efficiency of $\eta_C=f_\Omega \cdot f_A \cdot f_T$=0.0043× 0.70/9=3.3×10$^{-1}$.

We have neglected another possible effect on optical coupling, internal self-absorption of emitted photons in the InGaAs epitaxial layers outside, and particularly above, the active region in FIG. 1, panel (a). However, this region is depleted under bias, with a large electric field, so electron hole pairs created there quickly drift in opposite directions, the holes moving down toward the emitter side where they can recombine with one of the plentiful electrons and emit a photon once again. This is a type of "photon recycling" which occurs in many LEDs and can improve the $\eta_{ext}$ significantly. However, in our device, only a fraction of the photons is expected to be recycled since the depletion region is only d=0.1 μm long. So assuming an absorption coefficient of 10$^4$ cm$^{-1}$, the fractional absorbance of this layer is only [1−exp(−α·d)]≈0.1. The heavily doped (2×10$^{18}$ cm$^{-3}$) layer above the depletion layer is much thicker (0.3 μm), but is also expected to be mostly bleached at the emission wavelength because of the high Fermi energy (≈138 meV) and therefore the larger effective band-gap because of the Burstein-Moss effect. Given these subtleties, it seems prudent to ignore the absorption and recycling effects in this first analysis.

IV-B. Recombination Efficiency

The radiative recombination process on the emitter side, represented by rate $R_R$, competes with the non-radiative recombination processes, represented collectively by rate $R_N$. This competition is represented by the "recombination" efficiency, $\eta_R$, which is defined by $$\eta_R \equiv R_R/(R_R + R_N). \tag{4}$$

As derived below, $\eta_R$ can be related to physical parameters of the structure through a rate-equation analysis and the assumption that the non-radiative recombination mechanism is electron-electron-hole Auger scattering. This leads to the expression $$\eta_R = (1 + C \cdot n/B)^{-1}, \tag{5}$$

where B and C are material-dependent constants, and n is the electron density in the recombination region on the emitter side of the device. For In$_{0.53}$Ga$_{0.47}$As, accepted values for B and C at room temperature are B≈1×10$^{-10}$ cm$^3$/s and C=7×10$^{-29}$ cm$^6$/s. FIG. 4, panel (c) displays $\eta_R$ as a function of n for these two coefficients. The curve shows that $\eta_R$ is quite high at low electron densities, >0.9 at n=1×10$^{17}$ cm$^{-3}$, but then falls to ≈0.6 at 1×10$^{18}$ cm$^{-3}$, and more rapidly to ~0.12 at 1×10$^{19}$ cm$^{-3}$. For our structure, which is doped N$_D$=2×10$^{18}$ cm$^{-3}$ over most of the emitter side of the structure, we assume n=N$_D$ and $\eta_R$=0.41 from FIG. 4, panel (c). Although n will likely increase to a higher value in the accumulation region immediately next to the double-barrier structure, this value of $\eta_R$=0.41 should be a good first approximation.

IV-C. Electrical Injection Efficiency

According to our model of FIG. 3, and the general definition of electrical injection efficiency in Appendix I, $\eta_E$ should be the interband tunneling current density $J_{inter}$ divided by the total electrical current density for both the interband and intraband $J_{intra}$ (i.e., primarily resonant tunneling) mechanisms. This is the most challenging efficiency to estimate because it is expected to be strongly dependent on bias voltage and highly sensitive to the material parameters of the device structure.

As discussed in more detail in Appendix IV, "Zener" tunneling is a universal phenomenon in semiconductors that entails the real-space transfer of electrons from the valence band of a semiconductor to the conduction band under the influence of a large internal electric field. As first put forth by Kane for direct, narrow-bandgap semiconductors like InSb, the internal electric field should be thought of as coupling the valence band(s) to the conduction band(s) such that valence-band electrons "leak" into the conduction band provided that the transfer is elastic. Kane derived the following expression for the generation rate of conduction-band free electrons from valence-band bound electrons in a direct-bandgap semiconductor:

$$g_Z = \frac{1}{18\pi}\left(\frac{eF}{\hbar}\right)^2 \left(\frac{m_r}{E_G}\right)^{1/2} \cdot \exp\left[\frac{-\pi \cdot m_r^{1/2} \cdot E_G^{3/2}}{2^{3/2} e\hbar F}\right] \tag{6}$$

It contains two material-dependent parameters, the bandgap energy $E_G$, and the reduced mass $m_r$=(1/$m_c$+1/$m_v$)$^{-1}$] where $m_c$ and $m_v$ are the electron and light-hole masses, respectively. It also contains a structurally dependent parameter F, the local electric field. The strongest effect on $g_Z$ occurs through the $E_G^{3/2}$ and $F^{-1}$ terms in the argument of the exponent. For $In_{0.53}Ga_{0.47}As$, we use $E_G=0.74$ eV, $m_c=0.042$ me, and $m_v=m_{lh}=0.051\ m_e$, so that $m_r=0.023\ m_e$ Although Kane derived Eqn. 6 assuming a uniform internal electric field, he mentioned that it can still be used with non-uniform fields F(z) by integrating Eqn (6) in one dimension over the region in which F(z) is large, i.e, $$J_{inter} = \frac{1}{18\pi}\left(\frac{e}{\hbar}\right)^2\left(\frac{m_r}{E_G}\right)^{1/2} \cdot \int_{Z_1}^{Z_2} F^2(z) \cdot \exp\left[\frac{-\pi m_r^{1/2} \cdot E_G^{3/2}}{2^{3/2} e\hbar F(z)}\right] dz \quad (7)$$

where $z_1$ and $z_2$ define the boundaries of the high-field region. Although a straightforward generalization, this expression has a significant limitation at low-to-moderate fields, as discussed below, where the interband tunneling will occur over such a large physical distance that the fields at the valence-band "turning point" and the conduction-band "turning point" will be significantly different, jeopardizing the accuracy of Eqn. 6.

The electric field is calculated from the potential profile $\phi(z)$ by $F=d\phi/dz$ where $\phi(z)$ is the electron potential-energy profile computed from a model described in Appendix V. The resulting $\phi(z)$ is plotted in FIG. 5, panel (a) at a bias voltage of +1.8 V across the device, corresponding to the peak voltage of the NDR region in FIG. 2, panel (a). The AlAs barriers are assumed to present an electron barrier height of $\phi_{B,e}=0.68\cdot[E_G(AlAs)-E_G(InGaAs)]$, and a hole-barrier height of $\phi_{B,h}=0.32\cdot[E_G(AlAs)-E_G(InGaAs)]$, where $E_G$ (AlAs) is the room-temperature band gap ($\approx 3.0$ eV) of AlAs at the F point, and $E_G$ (InGaAs) is the bandgap of $In_{0.53}Ga_{0.47}As$ ($\approx 0.75$ eV) at the same point. This is the same band offset as for the lattice-matched $In_{0.53}Ga_{0.47}As/In_{0.52}Al_{0.48}As$ heterojunction. It ignores the lateral tensile strain that the thin AlAs barriers undergo when embedded in $In_{0.53}Ga_{0.47}As$—an issue still not fully resolved after 30 years of application.

The corresponding electric field is plotted in FIG. 5, panel (b), which shows that the maximum field occurs across the double-barrier structure. Numerical substitution of the field profile of FIG. 5, panel (b) into Eq (1) yields the Zener generation rate plotted in FIG. 5, panel (c), again at a bias voltage of +1.8 V. As expected, the Zener generation is greatest where the electric field is the highest, at or near the double-barrier structure, but becomes negligible $\approx 1000$ Angstrom away on the collector side and $\approx 100$ Angstrom away on the emitter side. To convert the generation rate into a hole-current density, we carry out the integral of Eqn. (2) across the electric field profile in FIG. 5, panel (b), and repeat this over a voltage range matching the experimental I-V curve in FIG. 2, panel (a), solving for the potential profile at each bias point.

The resulting interband current density curve, $J_{inter}$ vs V is plotted in FIG. 6 along with the experimental J-V curve, which is obtained from FIG. 2, panel (a) by dividing the absolute current by the active area of 176 $\mu m^2$. We see that the interband curve rises much more rapidly than the total current density, presumably because the total current is dominated by the intraband (resonant tunneling) mechanisms that have a much weaker dependence on internal field and bias voltage than the interband mechanism, and even decrease with increasing bias in the NDR region. To relate to our goal of estimating the light emission efficiency, we take the ratio of the (model) interband current density to the total density and plot this on the right vertical axis as the $\eta_E$—the electrical injection efficiency. It is quite low below the peak voltage, but then increases very rapidly through the NDR region where the interband component continues to rise, but the total current decreases. At the valley-point bias and beyond, $J_{inter}$ and $\eta_E$ behave similarly, and $\eta_E$ reaches values >0.1 (10%), as shown in FIG. 6. Before ascribing any physical interpretation to this, it is necessary to go back and compare experimental and model values of $\eta_{ext}$.

IV-D. External Quantum Efficiency and Discussion

We can now combine the model $\eta_C$, $\eta_R$, and $\eta_E$ values to calculate $\eta_{ext}$, which is plotted in FIG. 7 (left vertical axis) against the experimental curve from FIG. 2, panel (d). Remarkably, the experimental $\eta_{ext}$ is within 40% of the model value at the valley voltage and above, and its similar behavior vs. bias suggests that the model is valid in this range. By contrast, below, the valley voltage and through the NDR region and below, the model $\eta_{ext}$ is well under the experimental curve. And at a bias voltage of 1.5 V where the electroluminescence measurements are still considered accurate, the experimental results exceed the model by $\sim 30\times$.

The comparison of FIG. 7 raises two interesting points that are essential to the technology of this Application. First, the good agreement at bias voltages beyond the valley point suggest that the proposed interband tunneling model is valid at high bias voltages where the electric field across the double-barrier structure and depletion layer is large and slowly varying compared to lower bias voltages. These are the conditions under which we expect the Kane model of Eqn. (7) to be most accurate. Then by inspection of the three efficiency terms of the $\eta_{ext}$ model, we see in FIG. 7 that $\eta_E>0.1$ in the high bias region, along with $\eta_C=3.3\times 10^{-4}$ and $\eta_R=0.41$, both assumed independent of bias. In other words, the limitation on the external quantum efficiency of the present RTD light emitter is the optical coupling efficiency, not the injection or recombination efficiencies.

To further emphasize this point, FIG. 7 also shows (right vertical axis) the internal quantum efficiency $\eta_{int}$ rises from 3.6 to 7.4% between 2.5 and 3.0 V bias. According to our model, an obvious way to increase this substantially is to reduce the electron resonant-tunneling current density to levels close to, or even smaller than the interband current density, thereby increasing $\eta_{int}$ to values >0.5. A simple way to do this is simply to increase the AlAs barrier thickness by a few monolayer greater than the present thickness (2.4 nm). This is a proven technique in RTD design and practice, and an example of our "co-tunneling" light emitting design—a fascinating new quantum-effect design strategy made possible by this new device functionality.

At bias voltages well below the NDR region, the bias field will be significantly weaker and less uniform across the structure compared to higher bias. Furthermore, and perhaps more importantly, our model of the band bending across the double-barrier RTD structure has neglected the charge accumulation in the quantum well, and the complicated band bending created by quasi-2DEG behavior on the emitter side immediately adjacent to the double-barrier structure. This so called "pre-well" effect has been the subject of debate in RTDs for almost 30 years, and one of the only points of consensus is that the quantum well is charged according to $\sigma_{QW}=J_{intra}\cdot\tau/e$, where $\sigma_{QW}$ is the quantum-well electron sheet density [electrons/cm$^2$], $J_{intra}$ is the resonant tunneling current density, and $\tau$ is the quantum well quasibound-state lifetime. In the present RTD structure this leads to peak $\sigma_{QW}$ values of $\sim 10^{12}$ electrons/cm$^2$, which should have a significant effect on the band-bending in the structure at bias voltages up to the NDR region, but much less effect at the valley voltage and beyond where the quantum well discharges.

V. Other Material Systems for Infrared Emission by Co-Tunneling

The $In_{0.53}Ga_{0.47}As$ RTD described above emits in the short-wave infrared (SWIR) region, which is generally defined by the wavelength range from ≈1.0-2.5 μm. The basic light-emission operation can be extended to longer wavelengths: the mid-wave infrared (MWIR) region from ≈3.0-5.0 um, and the long-wave infrared (LWIR) region from √8.0-120.0 um, as shown in FIG. 8. The general definition of these bands is that they represent "windows" where the atmospheric propagation is very good (absent of precipitation). In between these bands, there are still many useful applications, such as close-range thermal imaging. The key to getting our new IR emitters working at MWIR-to-LWIR wavelengths is to fabricate the RTDs to have smaller bandgaps than the $In_{0.53}Ga_{0.47}As$ in the emitter region. A listing of promising emitter materials is given in Table I.

typically less than about 30 Ang each. By so doing, the AlAs grows on the $In_{0.53}Ga_{0.47}As$ "pseudomorphically", meaning that the AlAs crystal lattice stretches in the lateral plane (perpendicular to the growth direction) to match the larger lattice constant of the $In_{0.53}Ga_{0.47}As$. If this barrier thickness is exceeded in RTD structures, crystal dislocations and related defects can occur in the barriers, which generally seriously degrade the tunneling behavior of electrons or holes. Note that this "pseudomorphic" growth technique is a common practice in modern heteroepitaxy by MBE, and occurs in such popular devices as high-electron-mobility field effect transistors, and strained layer quantum well lasers The n-type doping of the $In_{0.53}Ga_{0.47}As$/AlAs RTD structure is done by the in-situ incorporation of silicon donors carried out during the MBE growth. Because no p-type doping is required, the structure is easier to grow and requires less calibration than a traditional p-n (i.e., bipolar) doped device such as a pin photodiode or a p-n heterostructure bipolar transistor.

TABLE I

| Emitter Material | Direct Bandgap [eV] | Bandgap Lambda [um] | Lattice Constant [Ang] | Barrier Material | Direct Bandgap [eV] | Lattice Constant [Ang] | Lattice Mismatch [%] |
|---|---|---|---|---|---|---|---|
| In(0.53)Ga(0.47)As | 0.74 | 1.68 | 5.87 | AlAs | 2.95 | 5.66 | −3.58 |
| InAs | 0.354 | 3.50 | 6.06 | AlSb | 2.22 | 6.14 | 1.32 |
| InSb | 0.17 | 7.29 | 6.48 | AlSb | 2.22 | 6.14 | −5.25 |
| Hg(0.83)Cd(0.17)Te | 0.11 | 11.00 | 6.46 | CdTe | 1.50 | 6.48 | 0.26 |

A second issue in choosing double-barrier RTD material systems is the quality of the barrier material. Our preference in constructing double-barrier structures is to have the barrier material be a binary rather than ternary semiconductor. The reason, learned through decades of experience with semiconductor tunnel barriers, is that binary-semiconductor barriers create much less electron scattering during tunneling than ternary barriers. This in turn is caused by the variation in barrier height with lateral position caused by the randomness of the ternary alloy composition.

V-A. $In_{0.53}Ga_{0.47}As$/AlAs

The first material system claimed here, and the paradigm system for our initial IR demonstration and modeling, is $In_{0.53}Ga_{0.47}As$/AlAs. For many RTD applications, such as THz oscillators and picosecond switches, $In_{0.53}Ga_{0.47}As$/AlAsRTDs have set all the speed records, and maximum power output too. The materials parameters are listed in Table I, and the valence-conduction band-edge offsets are shown in FIG. 9, panel (a). This system has a Type-I band-edge offset scheme whereby the thin AlAs layers appear as barriers to both electrons and holes in the $In_{0.53}Ga_{0.47}As$. The room-temperature bandgap wavelength is $\lambda_g$=1.68 um, which is consistent with the observed emission peak at 1580 nm displayed in FIG. 2, panel (b). As described in Sec. IV above, the slightly shorter wavelength of the emission peak is attributed to quantization effects occurring in the "pre-well" portion of the emitter region adjacent to the first AlAs tunnel barrier. This should occur in all of the RTD material systems described here.

A challenge of the $In_{0.53}Ga_{0.47}As$/AlAsis crystalline lattice matching. As listed in Table I, $In_{0.53}Ga_{0.47}As$ has a lattice constant of 5.87 Ang and AlAs a lattice constant of 5.66 Ang. This rather significant "lattice mismatch" of −3.6% can overcome by keeping the AlAs barriers thin, V-B. InAs/AlSb The second RTD material described herein is the InAs/AlSb structure whose material parameters are listed in Table I, and the band-edge offsets shown in FIG. 9, panel (b). This material system has a long and successful history in high-speed RTD electronics having produced the record setting fundamental oscillation of 712 GHz in 1991 (a record that was maintained for about 20 years). The room-temperature InAs band-edge energy is 0.354 eV, corresponding to an expected emission wavelength of 3510 nm. This lies at the short end of MWIR band where there are many important applications and a supportive industry. One popular application is in thermal imaging, and a second is lidar. The long-wavelength of emitted light allows for reduced scattering in low visibility situations, such as, collision avoidance in foggy or rainy weather. As shown in FIG. 9, panel (b), the AlSb barriers embedded in InAs presents a Type-II ("staggered") offset. This means that the AlSb forms a barrier to electrons in the InAs, but a "well" to holes. This is expected to make the valence-to-conduction interband tunneling probability even higher than in Type-I structures like $In_{0.53}Ga_{0.47}As$/AlAs.

From Table I we see that the lattice mismatch between AlSb and InAs is 1.32%—much less than in $In_{0.53}Ga_{0.47}As$/AlAs. This increases the maximum allowable ("pseudomorphic limit") barrier thickness to a value of 50 Ang or more, making the barriers simpler to grow by MBE and perhaps thick enough to be grown by organometallic chemical vapor deposition (OMCVD). OMCVD is a much cheaper and faster growth technique, popular in industrial and production settings where cost and fabrication speed matter a lot. Like MBE, it can attain high accuracy in composition and in doping concentration, especially when only n-type doping is required. It's main drawback is roughness and lack of abruptness of the heterointerfaces, in this case between InAs and AlSb, or vice versa. This is known be an issue in the performance of high-speed RTDs, and the reason they are generally grown by MBE. However, it may not be as important in RTD light emitters, so OMCVD will be considered as a growth technique.

A bigger problem of the InAs/AlSb structure compared to $In_{0.53}Ga_{0.47}As$/AlAs is the much more rapid non-radiative recombination of electrons in the emitter region by the Auger effect. As discussed in Appendix III, Auger recombination usually degrades the overall radiation efficiency in semiconductor light radiators, especially those having narrow bandgap. The active Auger mechanism on the emitter side of the RTD structure is thought to involve two electrons and one hole, so the Auger lifetime scales directly with semiconductor band gap, and inversely with free electron concentration. In other words, the Auger non-radiative lifetime gets shorter, and reduces the radiative efficiency, as the bandgap becomes narrower and the electron concentration increases.

Auger recombination can be suppressed to some extent by reducing the n-type doping on the emitter side of the structure to a maximum of $\sim 1 \times 10^{17}$ cm$^{-3}$ or less. But of greater importance is the doping profile, as shown for the paradigm $In_{0.53}Ga_{0.47}As$/AlAs device in FIG. 1, panel (a). This particular profile is designed to create a large sheet-charge density of electrons in the "pre-well" on the emitter side, as shown in the qualitative band bending diagram of FIG. 3, panel (a). This helps create a very high resonant-tunneling peak current density, which is important for high-speed electronic applications. However, for the light emission applications, the electron current density can be significantly lower, and should be close to the interband tunneling current density for high injection efficiency (see Sec. IVC). This can be accomplished by reducing the electron sheet density that builds up in the pre-well under bias, and various techniques are being considered including heterostructural ones.

V-C. $Hg_{1-x}Cd_xTe$/CdTe

One of the most interesting and effective semiconductors in history is the II-VI material $Hg_{1-x}Cd_xTe$/CdTe. It has a simple crystal structure (cubic: zincblende) and when the Hg fraction is high ($\geq 0.8$), and the Cd fraction is low ($<0.2$), the band gap between the valence and conduction bands is $\approx 0.10$ eV (12.4 um). So $Hg_{1-x}C_xTe$/CdTe has been applied for decades as both a photoconductive and photovoltaic detector material for the LWIR infrared band. It still holds the record for most sensitive photodetector performance in this band when cooled to 77 K.

And $Hg_{1-x}Cd_xTe$ has an attractive property that when used with CdTe barriers, the lattice match is excellent for all values of Cd fraction, as shown in Table I. Hence there is no need for particular attention to pseudomorphic growth in the barriers. However, fast Auger recombination is a great concern, so that the same doping profile strategy as described above for the InAs/AlSb, will have to be practiced for the $Hg_{1-x}Cd_xTe$/CdTe structures as well.

VI. Negative-Resistance Light-Emission Correlation: Self-Modulation Effects

VI-A. Relationship between Resonant Tunneling and Light Emission

As mentioned in the previous sections, an electroluminescence (EL) phenomenon has already been observed in conventional $In_{0.53}GaAs_{0.47}$/AlAs RTD devices with absence of p type doping. The indispensable holes for the light emission are produced by the Zener interband tunneling across the $In_{0.53}Ga_{0.47}As$ bandgap. The unipolar EL is a cross-bandgap recombination occurring mostly in the $In_{0.53}Ga_{0.47}As$ emitter region as evidenced by that the EL's spectrum is centered just above the bandgap of $In_{0.53}Ga_{0.47}As$.

By analyzing the current-voltage (I-V) and light intensity-voltage (L-V) curves of the InGaAs/AlAs RTDs, we discover that the cross-bandgap recombination and the interband tunneling might be correlated, instead of being two independent processes occurring in sequence. Together they comprise a second-order quantum-mechanical process enabling electrons to travel from the emitter region to the collector region as resonant tunneling does, but with a significant difference in that it permits the change of potential energy by emitting photons. This second-order quantum process is weaker compared to the resonant tunneling because the probability of the interband tunneling is small. Yet it sometimes displays the interesting property that the light emission intensity vs. bias voltage is anti-correlated to the NDR. To be specific, the light intensity increases while the resonant tunneling current decreases when the bias voltage is in the NDR, and vice versus, the light intensity decreases while the resonant tunneling current increases when the bias voltage passes by the NDR's valley into the second differential resistance (PDR) region. To the best of our knowledge, the unipolar doped EL and its correlative behavior to the NDR in RTD devices has never been discussed in the past 40 plus years of RTD literature.

FIG. 10, panel (a) shows the I-V curve and L-V curve of a RTD device measured at ~8 K. The L-V curve displays an anti-correlation relationship between the EL emission and the NDR region of the I-V curve. The EL emission spectrum was also measured under several bias voltages covering the three operation regions of the RTD, namely: the first positive differential resistance (PDR) region, the NDR region, and the second PDR region. As shown in FIG. 11, the spectral emission signal is the strongest when the bias voltage was set at ~2.8 V—in the NDR region, consistent with the L-V curve FIG. 10, panel (a). FIG. 11 plots the I-V curve and L-V curve of a RTD device measured at 300 K. Again, there is an anti-correlation displayed between the EL and the NDR. Noticeably, whenever there is a discontinuity in the NDR region, there is also a discontinuity in the L-V curve (green ellipses of FIG. 11). The anti-correlation suggests that the interband tunneling and the cross-band recombination are related physically; otherwise, the light emission intensity would increase monotonically with respect to the bias voltage.

VI-B. Self-Oscillation Effects

One of the most fascinating characteristics of the NDR is that it can provide electrical self-oscillations when the RTD is embedded into a properly matched circuit (or cavity). Because of the anti-correlation between the NDR and the EL emission, it is expected that the EL signal would be oscillating but with an opposite phase to the RTD's self-oscillation. To test the idea, the following experiment was conducted. An Anritsu bias tee was placed at the center of the circuit connection. Its DC port was to provide a bias voltage in the RTD NDR region. Its RF port was connected to a microwave directional coupler, whose output port was terminated with a short and coupling port (the 10 dB port) was monitored with a standard oscilloscope. By doing so, the directional coupler acted as a cavity inducing the RF self-oscillation of the NDR. The photocurrent from the InGaAs photodetector was converted to voltage signal using a trans-impedance amplifier (TIA) with a sensitivity of $10^{-8}$ A/V; and subsequently the voltage output of the TIA was amplified with a ~30 dB low-noise linear amplifier. The amplitude was high enough to be viewed on a second channel of the oscilloscope. Both the NDR self-oscillation and the light-signal self-oscillation are shown FIG. 12, and they are 180 degree out of phase. The "clock" frequency is only 7.1 kHz. This slow speed is likely due to the long length of the RF "cavity", which determines the resonant frequency of the NDR oscillation, and the sensitivity of the trans-impedance amplifier which falls off quickly after 10 kHz. Nevertheless, this experimental data supports the anti-correlation relationship between the NDR and the EL emission, agreeing with the I-V and L-V curves.

VI-C. Quantum Mechanical Modeling of Light Emission Process

To explain this anti-correlation, we first consider how a conduction electron can transfer from the emitter side of the double-barrier structure to the collector side via a second-order quantum process the resonant tunneling through the double-barrier structure. The RTD structure is under the force of a DC electric field $\xi_0$. The resulting Hamiltonian is $H_0(z)$, from which we can calculate the zero-order wave-functions. z is position along the direction of heterostructure stack. The wavefunction for a conduction-band electron with energy $E_{ce}$ and momentum $k_{c,e}$ in the emitter is written as $|s> = |\Phi b_{ce}(E_{ce}, k_{ce}, z)>$. Next we consider the Zener interband tunneling process between the valence band in the emitter region and the conduction band in the collector region with a two-band model. The wavefunction for a conduction-band state in the collector with energy $E_{cc}$ and momentum of $k_{cc}$ is $|n> = |\Phi_{cc}, k_{cc}, z)>$ [FIG. 13, panel (b)].

The wavefunction for a valence electron state in the emitter is $|m> = |\Phi_{ve}(E_{ve}, k_{ve}, z)>$ with eigen-energy of $E_{ve}$ and momentum $k_{ve}$. To describe the tunneling effect, both $|n>$ and $|m>$ in the forbidden region can be written into the WKB solutions, respectively. The Zener interband tunneling rate can be estimated from the following perturbation Hamiltonian, $H_t$ $$H_t = \frac{i\hbar E_g e \xi_0 P}{2m_v^* \left[ e\xi_0(z - z_{cn}) - \frac{1}{2}E_g + E_{ve} - U_{cn} \right]^2} \quad (8)$$

through the Fermi Golden rule. The definitions of all the variables can be found in the Appendix VI. The perturbation from a periodic time-varying optical field for the photon emission is written in the optical-dipole form: $H_{op} = -eF \cdot r[\cos(\omega_2 t)]$, where e is the electron charge, $\omega_2$ is the frequency of light emission, F is the vector optical field, and r is the vector spatial coordinate.

The total Hamiltonian is written into a form of $H_0 + H'$, where the perturbation $H' = H_t + H_{op}$ is the summation of both the interband tunneling and the optical transition.

We draw a Feynman diagram to illustrate these wavefunctions, which is shown in FIG. 13, panel (a). Accordingly, the second-order perturbation to the conduction-band wavefunction in the emitter is obtained from, $$\Psi_{0,\omega_2}^{(2)} = -\left(\frac{1}{\hbar}\right)^2 \sum_m \sum_s \int_0^t \exp[-i\omega_s(t-t_1)] \exp(-i\omega_m t_1) |s> <s|H'(t_1)|m>$$

$$dt_1 \int_0^{t_1 > t_2} \exp(i\omega_{mn} t_2) <m|H'(t_2)|n> dt_2 \quad (9)$$

where the definition of $t^1$ and $t^2$ is labeled in FIG. 13, panel (a).

The frequency difference such as $\omega_{mn}$ is defined by the energy level separation between the energy levels as $\omega_{mn} = 2\pi(E_{ve} - E_{ce})/h$.

The total rate an electron from the emitter migrating to the collector contact through the non-resonant tunneling is $$P(\omega_2) \approx \quad (10)$$

$$\frac{\pi}{8\hbar^3} \sum_{s=E_{cc},k_{cc}} \sum_{s=E_{ce},k_{ce}} \sum_{m=E_{ve},k_{ve}} \frac{|O_{sm} I_{mn}|^2}{\omega_{mn}^2 + \gamma^2} f_c(E_{ce})[1 - f_c(E_{cc})]$$

$$\delta(E_{ce} - E_{ve} + \hbar\omega_2)$$

where $f_e(E_{ce})$ and $f_c(E_{cc})$ are the occupation probabilities in the emitter contact and the collector contact, respectively.

$\gamma$ is a small positive value with a physical meaning such that $1/\gamma$ is to characterize the time scale of the interband tunneling.

The first matrix element $I_{mn} = <m|H_t|n>$ is for the interband tunneling. There is no any involvement of photon emission during this process. The second matrix element $O_{sm} = <s|H_{op}|m>$ is for the optical transition.

The term $O_{sm} I_{mn}$ of Equation (10) suggests the second-quantum transition from the emitter contact to the collector contact under a strong DC field can be a product of Zener interband tunneling and optical transition. It is a tunneling induced photon emission (TIPE). It is similar to photon-assisted tunneling process.

When the RTD device is biased at the NDR region, the wavefunction $|\Phi_{ce})E_{ce}, k_{ce}, z)>$ in the emitter gains amplitude due to the increasing blockade from the double potential barriers of the RTD device. Accordingly, the matrix element, $|O_{sm}|$, increases according to Eq. (10); thus, the light emission intensity increases. As soon as the bias voltage swings passing the plateau close to the valley of the NDR region, the wavefunction $|\Phi_{ce}(E_{ce}, l_{ce}, z)>$ in the emitter region begins to reduce its amplitude because of the increasing intraband tunneling probability through the double barriers [FIG. 13, panel (b)]. The amplitude of the matrix element $|O_{sm}|$ falls, so that the light intensity decreases. This explains the anti-correlation relationship between the L-V curve and the I-V curve in the NDR region. The correlation is consistent with the requirement of the charge naturalization. In other words, those holes in the valence band of the emitter generated by the interband tunneling need be annihilated versus the means of optical recombination.

VI-D. The Coupling Between the Unipolar Lasing and Relaxation Oscillation

The unipolar 1550 nm emission (or other wavelengths) from a double barrier emitter can be coupled to the high frequency self-oscillation through a laser cavity. The optical cavity can be the conventional, cleaved-end-facet approach with confinement of the spatial mode by "stripe" mesa isolation to make single-wavelength, high-power lasers with good beam quality and emission stability.

The high frequency self-oscillation is supported by a transmission-line relaxation oscillator approach, which can be used to couple with the optical cavity. A key aspect of this relaxation oscillation is frequency stability, usually quantified by timing "jitter" of the rising and falling edges (as low as ~200 fs for injection locking frequency 1.142 GHz). RTD relaxation oscillations are known to be extremely stable, in part because the peak and valley points of unipolar RTDs are robust with respect to temperature, power supply fluctuations, etc.

To achieve relaxation oscillation, the RTD is connected to a transmission line that is shorted at one end, the transmission line being a coplanar waveguide. The RTD is then biased to just below the peak voltage or just beyond the valley voltage of FIG. 14, panel (a), panel (b) and induced to switch to the valley or peak points, respectively, by a small variation or fluctuation of the bias voltage. The fast switching action of the RTD creates a voltage pulse that propagates down the transmission line to the short, and then reflected and inverted in sign. When the reflected pulse gets back to the RTD, it induces the alternate switching event. Given a low-loss transmission line and weak coupling through the DC bias circuit, the sequence of pulses is self-sustaining and has repetition frequency $f_{rep} \approx (4T_P)^{-1}$ where $T_P$ is the pulse propagation time between the RTD and the short circuit. Now suppose that the RTD structure is the unipolar-doped light-emitter (for example InGaAs), and that the light emitting threshold voltage is close to the peak voltage of the NDR region. Then, as the RTD switches between the peak and valley points during sustained relaxation oscillations, the light emitted by the InGaAs structure is varying from off-to-on with a difference that depends on the width of the NDR region in voltage. But independent of this difference, the emitted light should have a square-wave like behavior in the time domain. In other words, it should behave as an optical "clock". The rise and fall times of the light waveform has not been characterized yet but judging from the unipolar nature of the emitter (for example, InGaAs), could be much faster than the rise and fall times of a conventional p-n LED emitter.

Furthermore, since the light emission turns on only at the NDR region where holes are generated through Zerner tunneling, thus the voltage pulses created by RTD's relaxation oscillation can serve as the role of "shutter" for active mode locking [FIG. 14, panel (c)]. If the repetition frequency $f_{rep}$ of the RTD switching events are made the same as the optical-cavity spacing $f_{opt}$, multiple optical modes in the optical cavity would be forced into the same phase in order to get the stimulated amplification or otherwise being damped away. This mode-locking would produce a train of ultrashort laser pulses with a frequency comb spaced at an interval of $f_{rep}$. Likewise, the annihilation of charged carriers by the optical transition would likely cause an "absorption loss" to the amplitude of voltage pulses. To overcome the loss, all the possible RF harmonics in the transmission-line cavity would be locked to the same phase. This would further reduce the low phase noise of the relaxation oscillation. A small mismatch between $f_{rep}$ and $f_{opt}$ is likely compensated by an offset frequency $f_0$ due to pulse-to-pulse phase shift, which is commonly encountered in mode-locked lasers.

So it is possible to establish two mode-locked processes using the same gain medium—the RTD unipolar emitter, one in the optical 1550 nm band (as gain) and the other in the RF band (as loss). Through the interaction of the two, we expect that the resulting optical "clock" can exhibit very low timing jitter (<100 fs).

The RTD-emitter optical "clock" can be integrated into 1550 nm optical communication circuits to carry out optical signal processing.

VII. Single-Barrier Unipolar-Doped Light Emitters

Optionally the RTD material systems described in Sec. I can be fabricated as single-barrier rather than the double-barrier devices. Although lacking the intrinsic negative differential resistance of RTDs, our models suggest that the single-barrier device will more easily balance the electron tunneling and interband tunneling current densities. Hence, they provide higher external quantum efficiency in light emission than the RTD structures, and therefore have higher "wall-socket" efficiency too. This will also make them easier to design for semiconductor lasers as they will run cooler and not require the elaborate thermal management that inefficient semiconductor lasers do. It is also conceivable that the single-barrier light emitters will be efficient enough to use as LEDs in their respective wavelength regions. LEDs can act as excellent target illuminators for imaging systems of all types.

VIII. Decomposition of External Quantum Efficiency

The decomposition of $\eta_{ext}$ into three separate efficiencies $\eta_R$, $\eta_E$, and $\eta_C$ is worth deriving to see the subtle differences between the present (unipolar-doped) emitter and the paradigm p-n light emitter. We start with the electron-hole radiative recombination process, represented by rate $R_R$ that is fundamental to all semiconductor-based emitters, and is always in competition to non-radiative recombination processes represented by $R_N$. The "recombination" efficiency $\eta_R$ is defined through the expression for the total radiated power within a given device structure:

$$P_R = h\nu \cdot R_R \cdot V_E = h\nu \cdot \eta_R \cdot (R_R + R_N) \cdot V_E, \quad (I.1)$$

where $$\eta_R \equiv R_R / (R_R + R_N). \quad (I.2)$$

$V_E$ is the volume on the emitter side over which significant emission occurs, and can be written as $V_E = A \cdot L_P$ where A is the active area and $L_P$ is a characteristic length over which a significant steady-state population of holes exists from the interband tunneling. In steady state, the total recombination rate $R_R + R_N$ must equal the hole generation rate $G_p$ as determined by the interband tunneling mechanism. Hence, $$R_R + R_N = G_p \approx J_{inter}/L_P = \eta_E (J_{inter} + J_{intra})/L_P, \quad (I.3)$$

where $\mu_E \equiv J_{inter}/(J_{inter} + J_{intra})$ is the electrical injection efficiency. This assumes that intraband electron current creates no holes [e.g., no impact ionization], such that Eqn (1.3) can be re-written as $$R_R + R_N = \eta_E (J_{tot})/L_P \quad (I.4)$$

where $J_{tot}$ is the total electrical current density through the structure. Substituting (4) into (1), we get a conventional expression for the internal radiated power $$P_{R,I} = h\nu \cdot \eta_R \cdot \eta_E (J_{tot}) \cdot A. \quad (I.5)$$

Since $P_R$ is just inside the device, we need a third efficiency to describe the fraction that emits into free space. This is the photon "collection" efficiency $\eta_C$ and is defined by $$P_{R,E} = h\nu \cdot \eta_R \cdot \eta_E \cdot \eta_C (J_{tot}) \cdot A = h\nu \cdot \eta_{ext}(J_{tot}) \cdot A \quad (16)$$

where $\eta_{ext}$ is the "external" quantum efficiency.

IX. Angular Transmittance

As is well known from electromagnetics and optics, the power transmittance, T, through a dielectric-air interface is a function of angle-of-incidence $\theta_1$, the angle of refraction $\theta_2$ and polarization with respect to the plane of incidence (perpendicular $T_\perp$ or parallel $T_{81}$). These dependences are expressed through the famous Fresnel equations of wave optics:

$$T_\perp = \left[\frac{2\eta_2\cos\theta_I}{\eta_2\cos\theta_I + \eta_1\cos\theta_T}\right]^2 \cdot \frac{\eta_1\cos\theta_T}{\eta_2\cos\theta_I} \quad \text{(II. 1)}$$

$$T_\parallel = \left[\frac{2\eta_2\cos\theta_I}{\eta_2\cos\theta_T + \eta_1\cos\theta_I}\right]^2 \cdot \frac{\eta_1\cos\theta_T}{\eta_2\cos\theta_I} \quad \text{(II. 2)}$$

where $\eta_1 (=377/n_1 \; [\Omega])$ and $\eta_2 \; (=377/n_2 \; [\Omega])$ are the respective intrinsic impedances of medium 1 and 2, and $n_1$ and $n_2$ are their refractive indices [i]. Plots are displayed of $T_\perp$ and $T_\parallel$ assuming $n_1=3.4$ ($In_{0.53}Ga_{0.47}As$ around $\lambda=1580$ nm. Both start at a normal incidence of $\approx 0.70$, and $T_\perp$ decreases monotonically down to zero at the critical angle for total internal reflection $\theta_{TIR}=17.1°$. By contrast, $T_\parallel$ first grows with increasing $\theta$ up to a maximum of 1.0 at $\approx 16.5°$ before dropping to zero at $\theta_{TIR}$. This interesting behavior of $T_\parallel$ is sometimes neglected in first-pass analyses of light-emitter behavior, but we include it here to maintain rigor.

When we compute the transmittance of a solid-angle of radiation, as occurs inside an omnidirectional light emitter, we must average over $\theta$ and polarization both, accounting for the fact that because the radiation is omnidirectional, there is more power with increasing $\theta$ from the normal direction:

$$<T> = \frac{\int_0^{\theta_1} \frac{1}{2}(T_\parallel + T_\perp)\sin\theta \cdot d\theta}{\int_0^{\theta_1} \sin\theta \cdot d\theta} = \quad \text{(II. 3)}$$

$$(1-\cos\theta_1)^{-1} \int_0^{\theta_1} \frac{1}{2}(T_\parallel + T_\perp)\sin\theta \cdot d\theta$$

We carry out this integral numerically to $\theta_1=7.6°$ and obtain $<T>=0.73$, which is the value we apply in the main text to our estimate of the optical coupling efficiency, $\eta_C$. This is just above the normal-incidence transmittance because of the opposing effects of $T_\perp$ and $T_\parallel$, at least out to $\theta_1$.

X. Estimation of Radiative Recombination Efficiency

We estimate $\eta_R$ using a rate-equation approach whereby the time-varying hole density, p, in the active region is given by $$dp/dt = G_P - R_R - R_N, \quad \text{(III.-1)}$$

with $G_P$ defined above. The radiative recombination term $R_R$ is defined conventionally by the expression, $$R_R = B \cdot n \cdot p, \quad \text{(III.2)}$$

where n is the free electron density in the same volume $V_p$ as the significant hole density, and B is bimolecular radiative recombination coefficient. Generally, n is determined by the detailed form of the accumulation region on the emitter side of FIG. 1, and is thus a function of the bias voltage. In the present analysis, we have assumed a fixed bias voltage, and make the important assumption that n is much greater than, and independent of p. This assumption may become invalid in more optimized structures designed specifically to enhance $J_{inter}$ and suppress $J_{intra}$, but it is reasonable in the structures tested to date.

The non-radiative rate, $R_R$, is more challenging and likely to be dependent on the material system used to make the structure. For example, the GaN/AlN double-barrier structures which have displayed electroluminescence in the near-UV can have a significant density of surface states at the GaN-AlN heterointerface or traps in the GaN, which would promote a significant contribution to $R_N$. In contrast, the $In_{0.53}Ga_{0.47}As/AlAs$ double-barrier structures that have displayed electroluminescence in the near-IR are usually considered more ideal with fewer defects. However, the InGaAs has a much smaller bandgap (0.75 eV) than the GaN (3.42 eV), which will promote Auger scattering on the emitter side. Since we are assuming n>>p, the most likely form of Auger scattering will be two electrons in the conduction band scatter in such a way that one drops down to the valence band, annihilating any available hole. The other electron is elevated in energy by approximately the bandgap energy, subsequently relaxing on the emitter side by phonon emission (heat generation). The non-radiative recombination rate can be written as, $$R_N = C \cdot n^2 \cdot p, \quad \text{(II.I3)}$$

where C is the Auger coefficient, and again, n is assumed to be a constant at any given bias voltage. Substitution of (III.2) and (III.3) back into (III1.) and (4) yields a steady-state (dp/dt=0) solution $$J_{inter}/L_p = B \cdot n \cdot p + C \cdot n^2 \cdot p \text{ or } p = J_{inter}/[L_p(B \cdot n + C \cdot n^2)] \quad \text{(III. 3)}$$

and $$\eta_R = B \cdot n \cdot p / (B \cdot n \cdot p + C \cdot n^2 \cdot p) = (1 + C \cdot n/B)^{-1} \quad \text{(III. 4)}$$

XI. Interband Tunneling Current

Interband tunneling has a somewhat obscure history that warrants a brief discussion of its origins and assumptions. Also often called "Zener" tunneling, it is a universal phenomenon in semiconductors that entails the real-space transfer of electrons from the valence band to the conduction band under the influence of a large internal electric field. As first derived in a seminal paper, quantum-mechanical "tunneling" is possible between two solid, electrically conducting regions separated by a thin, insulating "barrier" region of thickness T. The criterion for high tunneling probability is that the electric field F across the thin insulator be large enough that $eF \cdot T \geq \phi_B$, where $\phi_B$ is height of the energy barrier (eV). Zener did this derivation before the widespread acceptance of "band structure" in solids, so the electrons on both sides of the barrier were assumed to be "free" (as in the Sommerfeld-Fermi model of metals), not Bloch electrons. The transmission probability was calculated using the Wentzel-Kramers-Brillouin (WKB) approximation of quantum mechanics, and historically this represents the first calculation of "real-space transfer" of electrons by quantum transport in the solid state.

By the 1950s and the adoption of band-structure theory for semiconductors, a more accurate model was developed in which Zener tunneling occurred not by free electrons between two separate metals, but rather by electrons between occupied Bloch states in a valence band, and empty Bloch states in a conduction band—both bands occurring in the same "bulk" semiconductor. Again, the internal electric field must be high, but the condition for tunneling becomes $eF \cdot L \geq E_G$, where L is the distance over which the internal electric field is high, and $E_G$ is the semiconductor band-gap. As first described by Kane, the internal electric field should be thought of as coupling the valence band(s) to the conduction band(s) such that valence-band electrons are "leaking" into the conduction band provided that the transfer is elastic. The coupling between the bands was couched in terms of Kane's, then novel, "k-dot-p" perturbation theory, and found to be particularly strong when the transfer is elastic (i.e., initial valence-band energy=final conduction-band energy), and conserving of crystal momentum. By including only the light-hole band and the lowest conduction band (minimum at k=0) in the model, Kane derived the following formula for the generation rate of conduction-band free electrons, and therefore valence-band free holes, by interband tunneling of valence-band bound electrons in a direct-bandgap semiconductor:

$$g_z = \frac{1}{18\pi}\left(\frac{eF}{\hbar}\right)^2 \left(\frac{m_r}{E_G}\right)^{1/2} \cdot \exp\left[\frac{-\pi \cdot m_r^{1/2} \cdot E_G^{3/2}}{2^{3/2}e\hbar F}\right] \quad \text{(IV.1)}$$

It contains two material-dependent parameters, the bandgap energy $E_G$, and the reduced mass $m_r=(1/m_c+1/m_v)^{-1}$] where $m_c$ and $m_v$ are the electron and light-hole masses, respectively. It also contains a structural- and bias-dependent parameter F, the local electric field. The strongest effect on $g_z$ occurs through the $E_G^{3/2}$ and $F^{-1}$ terms in the argument of the exponent.

XII. Band Bending in RTD under Bias

A topic of longstanding interest in RTDs is the band bending under bias. Not only does this determine the location in bias voltage of the NDR region, but it also brings in the effect of charge storage in the quantum well and the Coulomb blockade effect that has been successfully utilized to explain the high intrinsic $f_{max}$ that RTD oscillators enjoy. In this first analysis of light emission and the proposed interband tunneling that creates it, we take a simplified approach. The interband tunneling is strongly dependent on the internal electric field F which from electrostatics is equal to $-d\phi/dz$ where $\phi$ is the electric potential $\phi(z)$ profile across the device under bias. To get $\phi(z)$, we make the following considerations. Although the double-barrier structure is undoped along with thin spacer layers adjacent to it, the outlying $In_{0.53}Ga_{0.47}As$ epitaxial layers [FIG. 1, panel (a)] have a doping profile designed for operation with positive bias on top through an ohmic contact. Under strong positive bias (~1.0 V or higher) to this top ohmic contact, the upper 1000-angstrom-thick layer doped $N_d=2\times10^{17}$ cm$^{-3}$ should be mostly depleted, with much smaller potential drop across the 3000-Å highly doped ($N_d=2\times10^{18}$ cm$^{-3}$) above it. Hence, we apply the "depletion approximation" on that (collector) side.

On the opposite (emitter) side there is a 100-Å layer doped $N_d=2\times10^{17}$ cm$^{-3}$ with a thicker layer doped $2\times10^{18}$ cm$^{-3}$ beyond. This dual-layer doping profile allows electrons to accumulate heavily next to the barriers without having the high density of donor atoms so close to the double-barrier structure that they adversely affect the resonant tunneling process. To model the potential profile on the emitter side, we make the assumption that the doping density is a constant independent of x, and equal to the doping concentration, i.e., $n_e=N_d=2.0\times10^{18}$ cm$^{-3}$. We then solve the one-dimensional Poisson's equation as in the semiconductor layer of a standard metal-insulator-semiconductor (MIS) structure given two boundary conditions on the E field: (1) E at the double-barrier interface is continuous and equal to the electric field across the double-barrier structure, and (2) E goes to zero in the emitter layer at a distance somewhat greater than the Debye screening length:

$$F(z)^2 = \left(\frac{2k_BT}{\varepsilon}\right) \cdot n_e \cdot \left[\exp\left(\frac{e\varphi(z)}{k_BT}\right) - \frac{e\varphi(z)}{k_BT} - 1\right] \quad \text{(V.1)}$$

where $\varepsilon = \varepsilon_r \cdot \varepsilon_0$, and $\varepsilon_r$ is the relative permittivity. Although this ignores both Coulomb effects from charge accumulation in the quantum well, and spatial quantization in the spacer layer adjacent to the double barrier structure, it does maintain overall-space charge neutrality under bias, and provides a total potential drop across the emitter comparable to that expected from a more detailed analysis. It has been used previously for first-pass estimation of the potential profile in RTDs, and provides reasonably good agreement with the experimental I-V curves once the resonant-tunneling process is modelled by a Breit-Wigner or similar representation.

XIII. The Second Order Perturbation Theory

The RTD structure is under the force of a DC electric field $\xi_0$). The resulted Hamiltonian is $H_0(z)$, from which we can calculate the zero-order wavefunctions. z is position along the direction of heterostructure stack. The wavefunction for a conduction-band electron with energy $E_{ce}$ and momentum $k_{c,e}$ in the emitter is written as $|s\rangle=|\Phi_{ce}, k_{ce,z}\rangle\rangle$. Next we consider the Zener interband tunneling process between the valence band in the emitter region and the conduction band in the collector region with a two-band model. The Hamiltonian for the conduction band in the collector is written as, $$H_0^c = \left[-e\xi_0(z-z_{cn}) + \frac{1}{2}E_g + U_{cn}\right] + \frac{E_gP^2}{2m_c^*\left[e\xi_0(z-z_{cn}) + \frac{1}{2}E_g + E_{cc} - U_{cn}\right]} \quad \text{(VI-1)}$$

where P is defined as the matrix element of the momentum. $U_{cn}$ is the potential at the center of the forbidden region with a coordinate of $z_{cn}$, and $m_c^*$ is the effective mass of electron. $E_g$ is the bandgap of InGaAs.

The wavefunction for a conduction-band state in the collector with energy $E_{cc}$ and momentum of $k_{cc}$ is $|n\rangle=|\Phi_{cc}(E_{cc},k_{cc},z)\rangle$.

The Hamiltonian for the valence band in the emitter is written as $$H_0^v = \left[-e\xi_0(z-z_{cn}) - \frac{1}{2}E_g + U_{cn}\right] + \frac{E_gP^2}{2m_v^*\left[e\xi_0(z-z_{cn}) - \frac{1}{2}E_g + E_{ve} - U_{cn}\right]} \quad \text{(VI-2)}$$

where $m_v^*$ is the effective mass of light hole.

The wavefunction for a valence electron state in the emitter is $|m\rangle=|\Phi_{ve}(E_{ve}, 1_{ve}, z)\rangle$ with eigen-energy of $E_{ve}$ and momentum $k_{ve}$.

To describe the tunneling effect, both $|n\rangle$ and $|m\rangle$ in the forbidden region can be written into the WKB solutions, respectively. The Zener interband tunneling rate can be estimated from the following perturbation Hamiltonian, $$H_t = \frac{i\hbar E_g e\xi_0 P}{2m_v^*\left[e\xi_0(z-z_{cn}) - \frac{1}{2}E_g + E_{ve} - U_{cn}\right]^2} \quad \text{(VI-3)}$$

through the Fermi Golden rule.

The perturbation from a periodic time-varying optical field for the photon emission is written in the optical-dipole form: $H_{op}=-eF\cdot r[\cos(\omega_2 t)]$, where e is the electron charge, $\omega_2$ is the frequency of light emission, F is the vector optical field, and r is the vector spatial coordinate.

The total Hamiltonian is written into a form of $H_0+H'$, where the perturbation $H_0+H'$, where the perturbation $H'=H_t+H_{op}$ is the summation of both the interband tunneling and the optical transition.

We draw a Feynman diagram to illustrate these wavefunctions, which is shown in FIG. 6, panel (a). Accordingly, the second-order perturbation to the conduction-band wavefunction in the emitter is obtained, $$\Psi^{(2)}_{0,\omega_2} = \qquad\qquad\qquad\qquad\qquad\qquad\qquad\text{(VI-4)}$$

$$-\left(\frac{1}{\hbar}\right)^2 \sum_m \sum_s \int_0^t \exp[-i\omega_s(t-t_1)]\exp(-i\omega_m t_1)|s><s|H'(t_1)|$$

$$m>dt_1 \int_0^{t_1>t_2} \exp(i\omega_{mn}t_2)<m|H'(t_2)|n>dt_2$$

where the definition of $t^1$ and $t^2$ is labeled in FIG. 6, panel (b). The first matrix element to consider is $$<m|H'(t_2)|n> = <\Phi_{ve}(E_{ve},k_{ve},z)|H'(t_2)|\Phi_{cc}(E_{cc},k_{cc},z)> \quad\text{(VI-5)}$$

$$= <\Phi_{cc}(E_{cc},k_{cc},z)|(H_t(t_2)+H_{op}(t_2))|$$

$$\Phi_{ve}(E_{ve},k_{ve},z)\Phi_{cc}(E_{cc},k_{cc},z)>$$

$$= <\Phi_{ve}(E_{ve},k_{ve},z)|H_t(t_2)|$$

$$\Phi_{cc}(E_{cc},k_{cc},z)> <\Phi_{ve}(E_{ve},k_{ve},z)$$

$$|H_{op}(t_2)|\Phi_{cc}(E_{cc},k_{cc},z)>$$

$$\approx <\Phi_{ve}(E_{ve},k_{ve},z)|H_t|\Phi_{cc}(E_{cc},k_{cc},z)>$$

$$= I_{mn}$$

where the dominant term $I_{mn}$ is for the interband tunneling. There is no any involvement of photon emission during this process.

The second matrix element is $$<s|H'|m> = <\Phi_{ce}(E_{ce},k_{ce},z)|H'(t_1)|\Phi_{ve}(E_{ve},k_{ve},z)> \quad\text{(VI-6)}$$

$$= <\Phi_{ce}(E_{ce},k_{ce},z)|H_t(t_1)|\Phi_{ve}(E_{ve},k_{ve},z)> +$$

$$<(\Phi_{ce}(E_{ce},k_{ce},z)|H_{op}(t_1)|\Phi_{ve}(E_{ve},k_{ve},z)>$$

$$\approx <\Phi_{ce}(E_{ce},k_{ce},z)|H_{op}(t_1)|\Phi_{ve}(E_{ve},k_{ve},z)>$$

$$= <\Phi_{ce}(E_{ce},k_{ce},z)|(-eFr)|\Phi_{ve}(E_{ve},k_{ve},z)>$$

$$\frac{\exp(i\omega_2 t_1)}{2}$$

$$= O_{sm}\frac{\exp(i\omega_2 t_1)}{2}$$

where the dominant term $O_{sm}$ is the optical recombination.

According to Eq. (VI-4), the wavefunction |s> is corrected by $$\Psi^{(2)}_{0,\omega_2} = \qquad\qquad\qquad\qquad\qquad\text{(VI-7)}$$

$$\frac{1}{2}\left(\frac{1}{\hbar}\right)^2 \sum_m \sum_s \frac{\exp[-i\omega_s t]O_{sn}I_{mn}\{\exp[i(\omega_{sn}+\omega_2)t_1]\}-1\}}{(\omega_{mn}-i\gamma)(\omega_{sm}+\omega_2)}|s>$$

where $\gamma$ is a small positive value with a physical meaning such that $1/\gamma$ is to characterize the time scale of the interband tunneling.

The frequency difference such as $\omega$mn is defined by the energy level separation between the energy levels as $\omega_{mn}=\omega_m-\omega_n=(E_{v,e}-E_{cc})/\hbar$. $\omega_{nm}$ and $\omega_{mn}$ are defined similarly.

Thus the probability of an electron from the emitter migrating to the collector contact through the non-resonant tunneling is written as $$|<s|\Psi^{(2)}_{0,\omega_2}>|^2 \approx \frac{1}{16\hbar^4}\sum_m \frac{|O_{sm}|^2|I_{mn}|^2\sin^2\frac{(\omega_{sm}+\omega_2)t}{2}}{(\omega_{mn}^2+\gamma^2)\left[\frac{1}{2}(\omega_{sm}+\omega_2)\right]^2} \quad\text{(VI-8)}$$

Accordingly, the transition rate is written as $$p(\omega_2) = \frac{\pi}{8\hbar^4}\sum_m \frac{|O_{sm}I_{mn}|^2}{\omega_{mn}^2+\gamma^2}\delta(\omega_{sm}+\omega_2) \quad\text{(VI-9)}$$

By summing all the initial and final states, the total rate is $$P(\omega_2) \approx \qquad\qquad\qquad\qquad\qquad\text{(VI-10)}$$

$$\frac{\pi}{8\hbar^3}\sum_{s=E_{cc},k_{cc}}\sum_{s=E_{ce},k_{ce}}\sum_{m=E_{ve},k_{ve}} \frac{|O_{sm}I_{mn}|^2}{\omega_{mn}^2+\gamma^2}f_c(E_{ce})[1-f_c(E_{cc})]$$

$$\delta(E_{ce}-E_{ve}+\hbar\omega_2)$$

where $f_e(E_{ce})$ and $f_c(E_{cc})$ are the occupation probabilities in the emitter contact and the collector contact, respectively.

Design Considerations for Interband Tunneling-induced Photon Emission

XIV.A. —Introduction

In the provisional application entitled "New Infrared Light Emitters Based on Interband Tunneling in Unipolar Doped n-Type Tunneling Structures," we have proposed four different material systems that will allow fabrication of double-barrier intraband resonant tunneling structures and strong interband (Zener) tunneling to achieve achieve strong cross-gap light emission. These material systems are: (1) $In_{0.53}Ga_{0.47}As$ with AlAs barriers, (2) InAs with AlSb barriers, (3) InSb with AlAs barriers, and (4) $Hg_xCd_{1-x}Te$ with CdTe barriers. Since our original submission, we have developed a design methodology based on electron tunneling theory and semiconductor transport which will allow each of these materials systems to be grown with optimal or near-optimal light-emission characteristics. The key performance criterion is internal quantum efficiency (IQE), which measures what fraction of the total (terminal) current flowing through the device contributes to electron-hole recombination. This can be explained more precisely through the band-bending diagram in FIG. 15, which applies to all four materials. The resonant tunneling of electrons on the collector side occurs by two mechanisms—(1) the elastic tunneling of electrons through the quantum well (shown by $U_1$ in FIG. 15) and represented by $J_{e1}$, and (2) the inelastic tunneling of electrons represented by $J_{e2}$. The interband (Zener) tunneling of electrons on the collector side, which creates the holes necessary for radiative recombination, is represented by $J_z$.

The first and foremost design criterion for optimizing the IQE is to maximize the ratio of $J_z$ to sum $J_{e1}+J_{e2}$. In high-quality RTDs, $J_{e1}$ dominates $J_{e2}$ up to the peak voltage of the I-V curve, shown as $V_P$ in the representative curve of FIG. 16. Then starting at the valley voltage $V_v$, $J_{e2}$ dominates $J_{e1}$ to a bias voltage of roughly V2 where $J_{e2}$ approaches $J_P$. Thus to maximize $J_{P1}/(J_{N1}+J_{N2})$, it is important to apply a bias voltage $V_B \geq V_v$ but not so high that $J_{e2}$ increases faster than $J_z$. In this range of bias, we want the electric field across the depletion region on the collector side to be as large as possible without causing device failure by thermal runaway or impact-ionization-induced avalanching. In general, the higher the bias voltage, the longer the depletion length $L_D$ shown in FIG. 15. But the peak voltage is strongly affected by the quantum-well width $L_W$, also shown in FIG. 15.

XIV.B. —Design of Zener Tunneling

Figure 17:
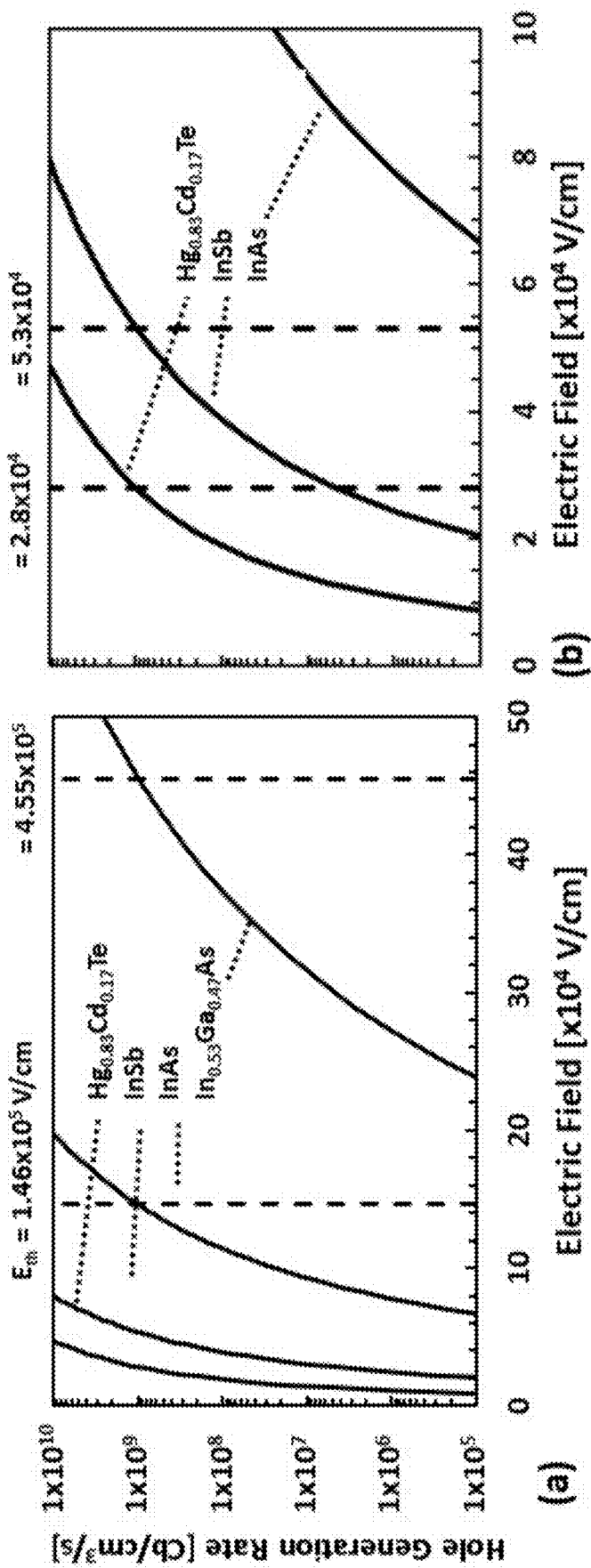
FIG. 17 illustrates in panels (a) and (b) the hole generation rate versus voltage for various materials.

As described in the provisional application, the Zener tunneling current $J_z$ is proportional to the generation rate $G_z$ first derived by Kane.

$$G_Z = \frac{1}{18\pi}\left(\frac{e}{\hbar}\right)^2 \left(\frac{m_r}{U_G}\right)^{1/2} \cdot E^2(z) \cdot \exp\left[\frac{-\pi \cdot m_r^{1/2} \cdot U_G^{3/2}}{2^{3/2} e\hbar \cdot E(z)}\right] \quad \text{(XIV-1)}$$

$$J_Z = \int_{z_1}^{z_2} G_Z \cdot dz = \quad \text{(XIV-2)}$$

$$\frac{1}{18\pi}\left(\frac{e}{\hbar}\right)^2 \left(\frac{m_r}{E_G}\right)^{1/2} \cdot \int_{z_1}^{z_2} F^2(z) \cdot \exp\left[\frac{-\pi \cdot m_r^{1/2} \cdot E_G^{3/2}}{2^{3/2} e\hbar F(z)}\right] dz$$

where $U_G$ is the energy bandgap, E is the internal electric field, and $m_r$ is the reduced effective mass. In the Kane model this is a weighted average between the electron and light-hole effective masses, $m_e^*$ and $m_{1h}^*$, respectively, and given by $m_r = m_e^* \cdot m_{1h}^*/(m_e^* + m_{1h}^* e)$. These quantities are listed in Table I for the four relevant base materials. Eqn (XIV-1) is complicated enough that it is difficult to glean design information analytically, so instead we show in FIG. 17 the plot of Eqn (XIV-1) vs internal electric field for the four material systems of interest. $G_z$ is a very rapidly increasing function of E in all cases, and becomes steeper with decreasing bandgap energy. This is an important aspect of the RTD-LED design—that there exists a threshold internal E field, $E_{th}$, for hole generation by Zener tunneling that depends strongly on the base material. To define $E_{th}$ more precisely, we note that in our experiments and analysis of the $In_{0.53}Ga_{0.47}As/AlAs$ RTD structure (provided in the provisional application), strong light emission starts to occur for internal field of $\approx 4.5 \times 10^5$ V/cm. According to FIG. 17, panel (a), the Zener generation rate at this bias is $G_z 1.0 \times 10^9$ Cb/cm³/s, where Cb is the unit of electrical charge (Coulomb). Using this value as a benchmark, and zooming in on the low-field region in FIG. 17, panel (b), we see that the threshold fields are $E_{th}=1.46\times 10^5$, $5.3\times 10^4$, and $2.8\times 10^4$ V/cm for InAs, InSb, and $Hg_{0.83}Cd_{0.17}Te$, respectively. In other words, the threshold E field drops by ~16× between InGaAs and HgCdTe even though the bandgap energy drops just under 7×. This is caused by the super-linear dependence on $U_g$ via the $(U_g)^{3/2}$ term in the argument of the exponent in Eqn. (XIV-1).

The threshold nature of $G_z$ vs E forces a design strategy that is tailored to the base material. The two primary design parameters are the quantum-well width $L_W$ in the double-barrier structure, and the depletion length LD on the collector side of the device. $L_W$ is adjusted so that the peak voltage of the RTD structure occurs with an internal field $E_w = E_{th}$. Then for bias above the peak, the RTD electron current $J_{e1}$ will be rapidly dropping, while $J_z$ is rapidly increasing, which supports achieving high IQE.

Once $L_W$ is chosen, $L_D$ will be adjusted to prevent background impact ionization from reaching the avalanche condition, and also to keep the terminal bias voltage for LED operation at practical levels, approximately less than 5.0 V.

XIV.C. —Design of $L_W$

Figure 18:
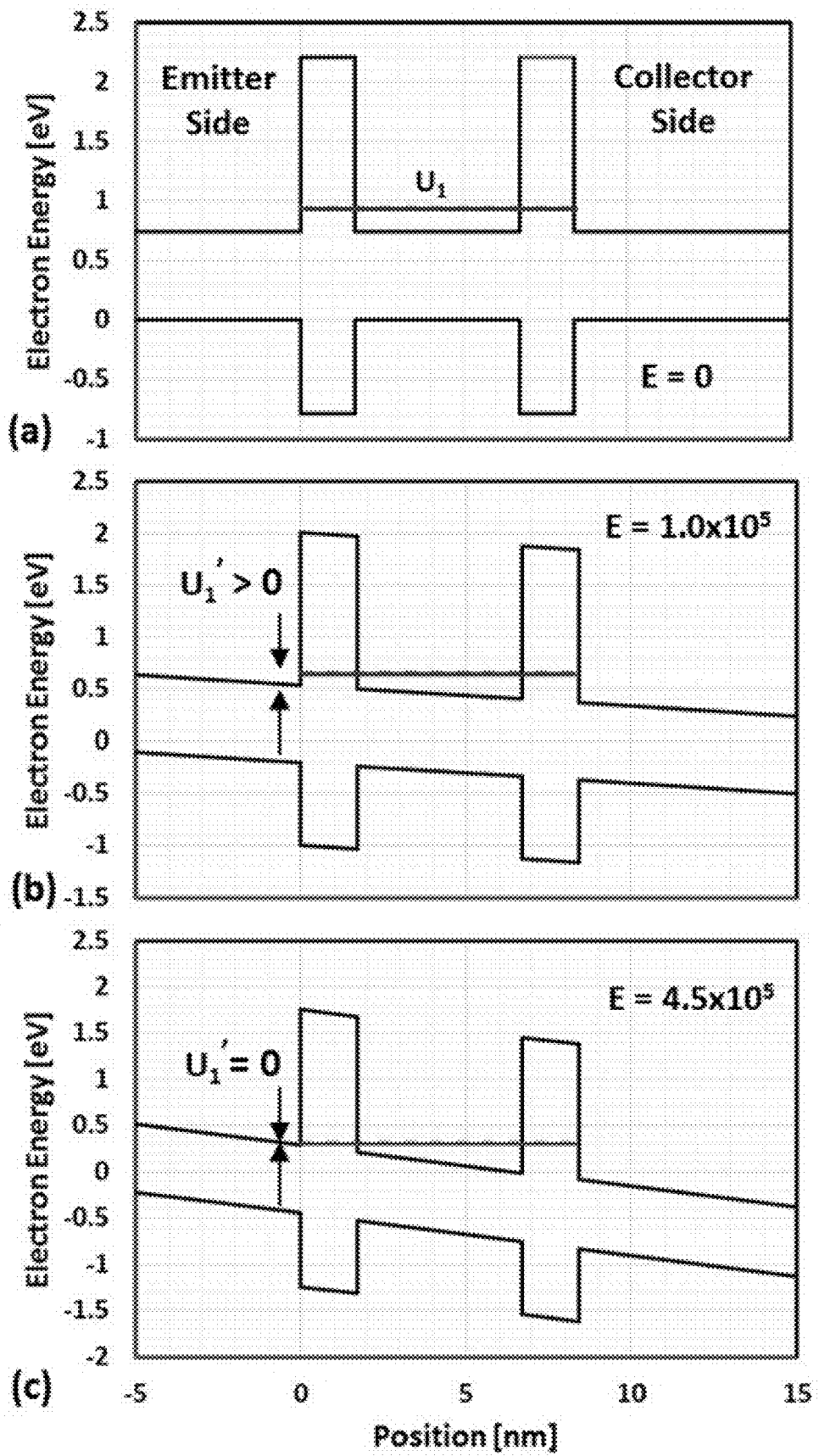
FIG. 18 illustrates in panels (a), (b), and (c) electron energy at various bias voltage levels for a device according to an embodiment.

The quantum well width affects the RTD peak voltage $V_P$ primarily by controlling the ground-state energy level $U_1$ relative to the conduction band edge of the quantum-well material, be it InGaAs, InAs, InSb, or HgCdTe. FIG. 18, panel (a) shows the quantum-well region at zero bias for the InGaAs/AlAs structure, and under an electric bias of $E_w$. From basic considerations in quantum mechanics, the ground-state energy measured relative to the conduction-band edge at zero bias is given by $$U_1 \approx \hbar^2 \cdot k^2 / 2m_e^* \quad \text{(XIV-3)}$$

where $\hbar$ is Planck's (circular) constant ($=h/2\pi$, $k=2\pi/\lambda_{eff}$ is the wave vector, and $\lambda_{eff}$ is the effective de-Broglie wavelength, and $m_e^*$ is the electron effective mass. As described above, in order to have high hole transfer from the collector side to the emitter side, the barriers must be thin—typically around 2.0 nm. In this case, $\lambda_{eff}=2\cdot(L_w+L_B)$ so that Eqn (XIV-3) becomes $$U_1 = \hbar^2/[8m_e^*(L_w+L_B)^2] \quad \text{(XIV-4)}$$

Figure 19:
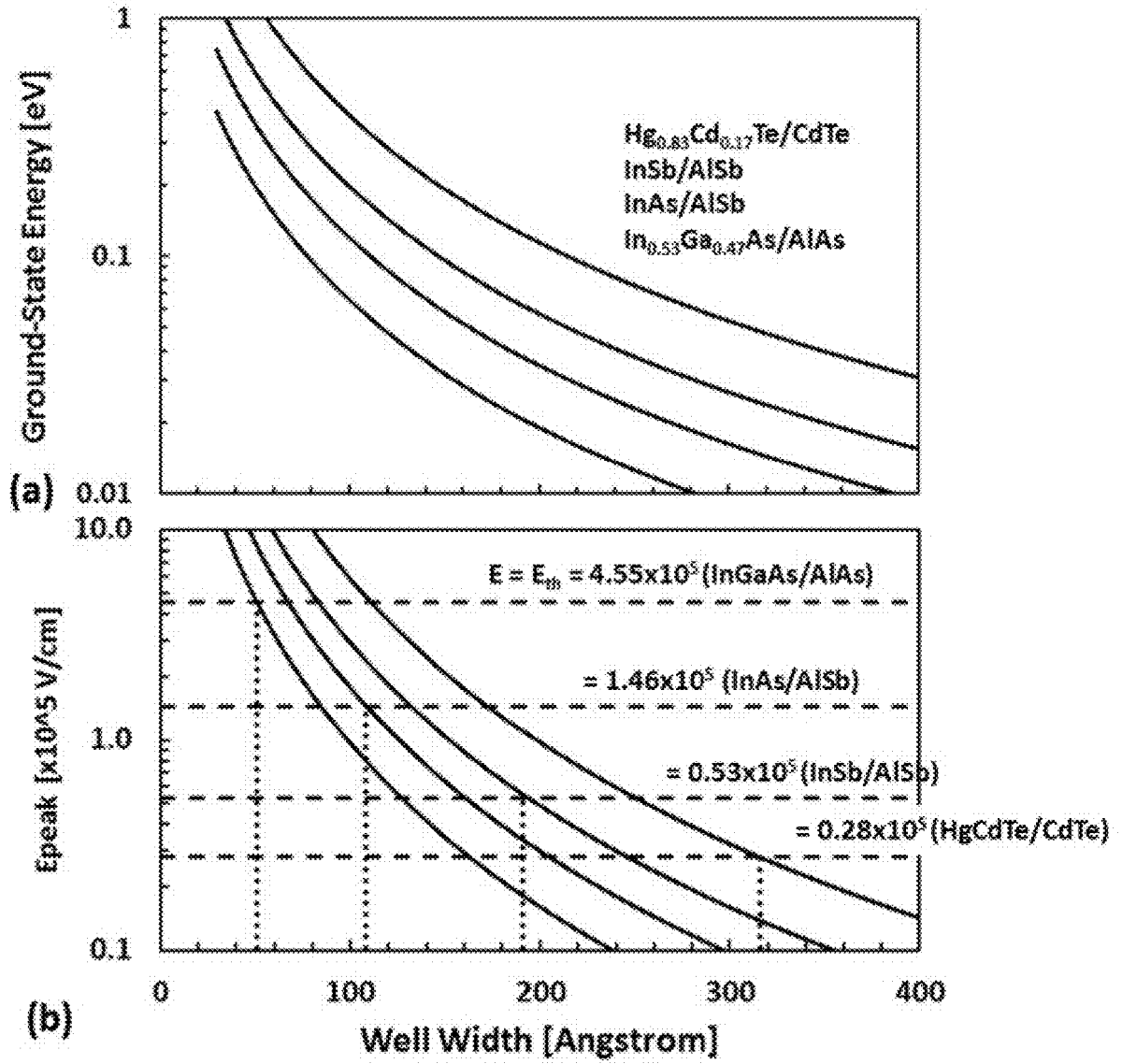
FIG. 19 illustrates in panels (a) and (b) the effect of field strength and quantum well size on ground-state energy.

A plot of $U_1$ vs $L_W$ is shown shown in FIG. 19, panel (a) for the materials of interest, again using $In_{0.53}Ga_{0.47}As$ as our control sample, assuming $L_B=1.7$ nm for all structures. At any given $L_w$, $U_1$ rises between the InGaAs and HgCdTe material structures since Eqn (XIV-4) depends inversely on the effective mass, which decreases monotonically between InGaAs and HgCdTe.

Under electric bias with E field $E_w$, the ground state naturally drops relative to the conduction band edge on the emitter side, which is described by the following expression:

$$U_1'=U_1-(1/2)eV_w=U_1-(1/2)e\cdot E_w(L_W+2\cdot L_B) \quad \text{(XIV-5)}$$

where $E_w$ and $V_w$ are the electric field and bias voltage-drop across the double-barrier structure, respectively, and e is the electron fundamental charge A good starting approximation for the condition of peak current density $J_p$ vs bias is that $U_1'=0$, as shown graphically in FIG. 18, panel (c), which leads to $$E_{peak} \approx 2 \cdot U_1/[e(L_w+2L_B)] \quad \text{(XIV-6)}$$

Figure 16:
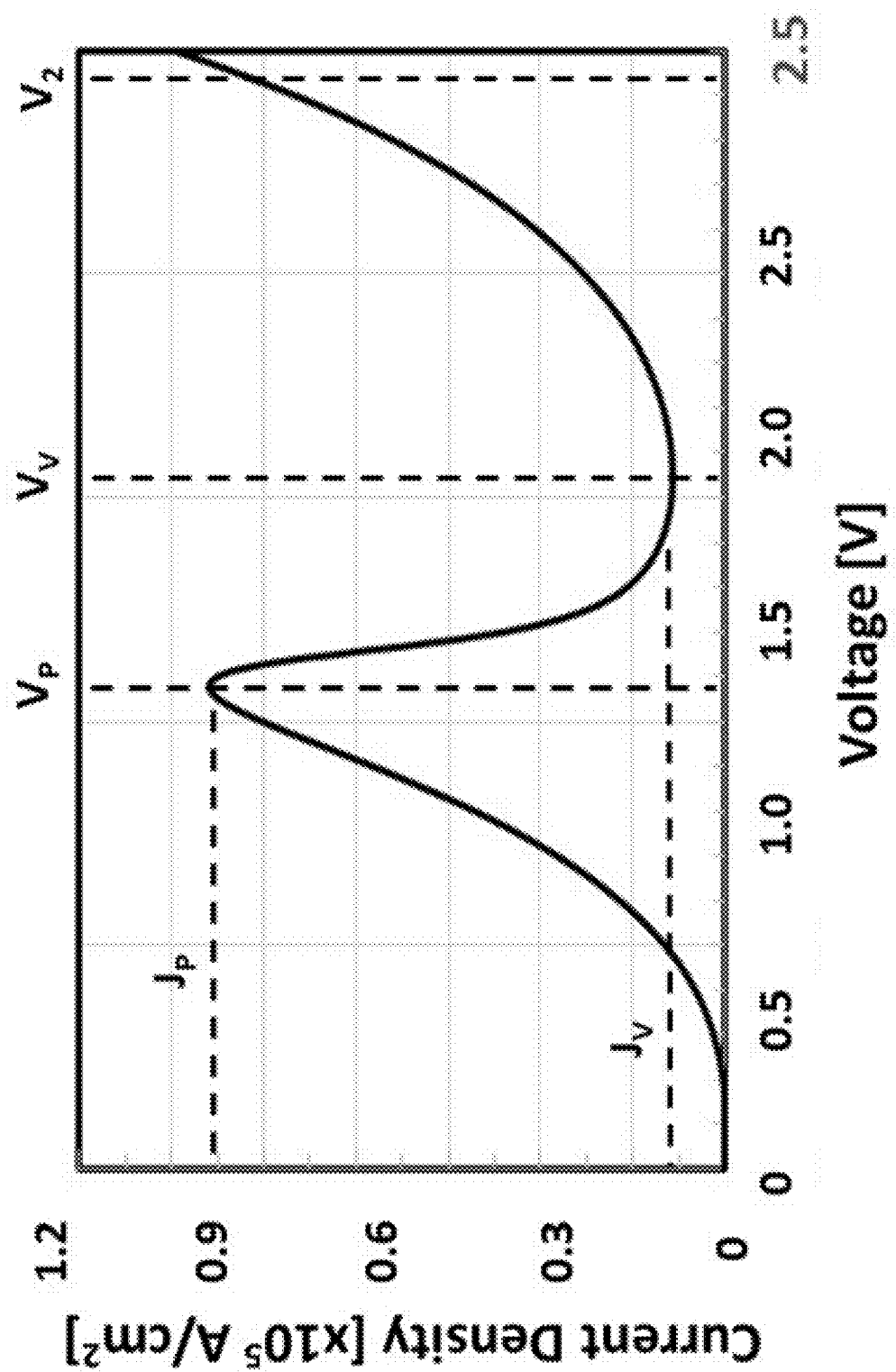
FIG. 16 illustrates the generation of charge carriers, according to an embodiment.

In other words, $E_{peak}$ is the electric field across the double-barrier structure that yields the peak current condition $J=J_p$ in FIG. 16.

The final design step for $L_W$ is to set $E_{peak}$ equal to the threshold field $E_{th}$ for strong Zener tunneling. This is done graphically in FIG. 198, panel (b) and also listed in Table II, where we find $L_w$=51, 108, 191, and 316 Angstrom for the InGaAs, InAs, InSb, and HgCdTe quantum wells, respectively. The $L_W$ values for InAs and HgCdTe are unusually large for semiconductor quantum-wells, so would likely require very high material quality to realize strong resonant tunneling through the ground state.

XIV.D. —Design of $L_D$

Figure 15:
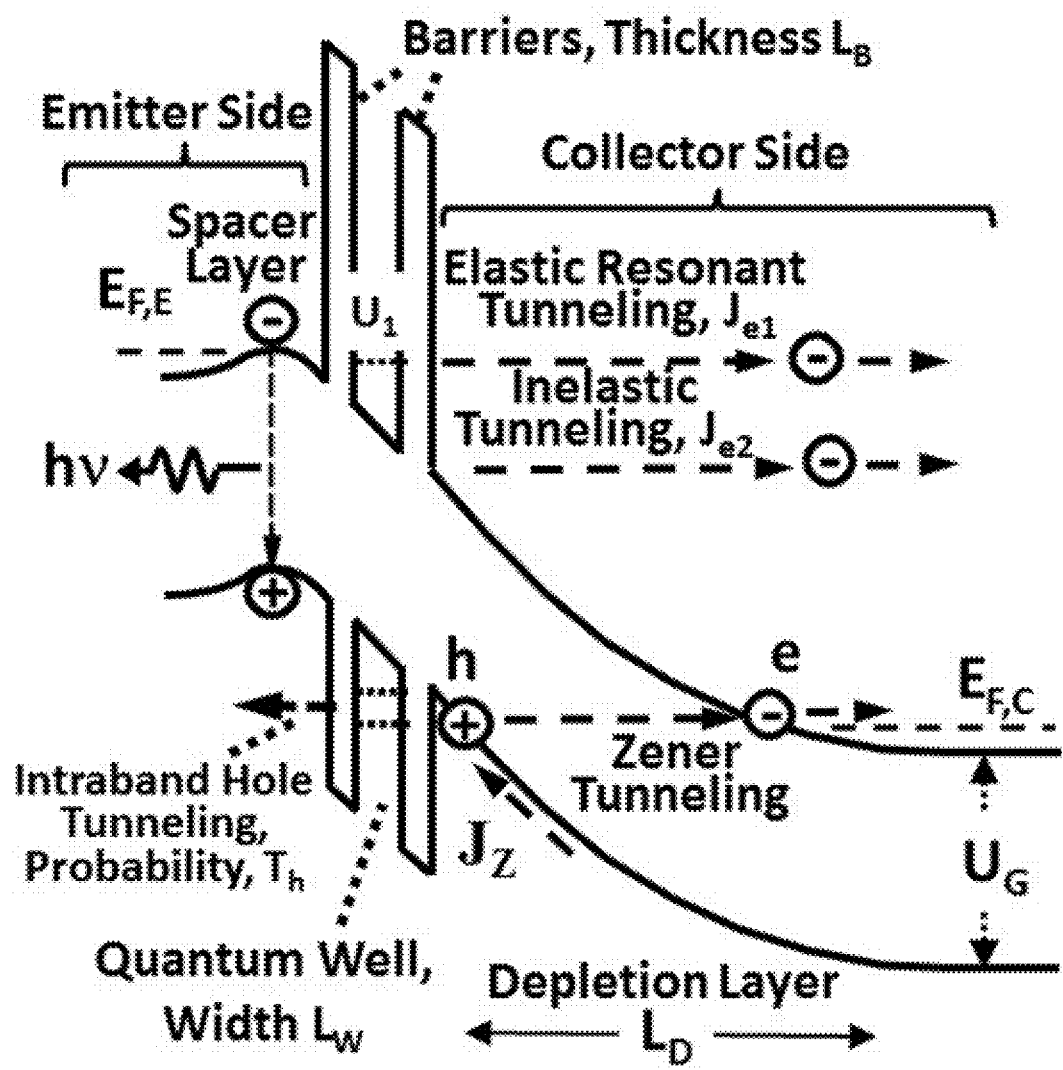
FIG. 15 illustrates a band-bending diagram describing the elastic and inelastic tunneling of electrons, according to an embodiment.

Knowing $L_W$ and the field across the double-barrier structure, we design the depletion length $L_D$ assuming the doping in the depletion layer of FIG. 15 is low enough (~1×10$^{16}$ cm$^{-3}$) that the electric field, $E_{peak}$=$E_{th}$, is approximately uniform across it. This is the same condition assumed in designing p-i-n photodiodes. Then we consider two constraints. First, we don't want the depletion region to support avalanche breakdown caused by runaway impact ionization. The condition for the onset of avalanching is $\alpha_e \cdot L_D$=1, where $\alpha_e$ is the electron impact ionization coefficient. To avoid this, we must set the depletion length $$L_D < L_{D,A} = \alpha_e^{-1}. \tag{XIV-7}$$

The quantity $\alpha_e$ is a strong function of E field, which we set equal to the peak value for each of the base materials. For example, In$_{0.53}$Ga$_{0.47}$As has $\alpha_e$=1.3×10$^4$ cm$^{-1}$ at E=$E_{peak}$=4.55×10$^5$ V/cm. Hence $L_{DA}$=766 nm. For InAs, $\alpha_e$=1.7×10$^4$ cm$^{-1}$ at E=$E_{peak}$=1.46×10$^5$ V/cm, for which $L_{D,A}$=578 nm. Although not as thoroughly studied as InGaAs or InAs, InSb is thought to have a similar value of $\alpha$ as InAs, so it too would be restricted to a depletion length of ~578 nm to avoid avalanche breakdown. HgCdTe is the least understood of our materials in terms of impact ionization so we do not yet have a depletion-length criterion for this material. The second constraint, a practical one, is associated with the desired bias voltage $V_B$. Given the universal USB standard of $V_B$=5.0 V, and assuming the majority of the bias voltage drops across the depletion region, we can write a bias-limited depletion length $L_{D,B}$ $$L_D < L_{D,B} = V_B/E_{peak} = 5.0/E_{peak} \tag{XIV-8}$$

We find $L_{D,B}$=10, 342, 943, and 1786 nm for InGaAs, InAs, InSb, and HgCdTe, respectively.

The maximum $L_D$ design value, $L_{D,max}$, is then the lesser of $L_{D,A}$ and $L_{D,B}$. So for InGaAs and InAs it is $L_{D,max}$=110 nm and 342 nm (both bias limited), and for InSb it is $L_{D,max}$578 nm (avalanche limited). Although we do not know $\alpha_e$ for HgCdTe, it is likely to be larger than for InSb, which would make $L_{D,max}$<578 nm for that material.

ADDITIONAL APPLICABILITY

In an embodiment, a semiconductor device operating at room temperature, having a unipolar doped light emitting diode (LED) or laser diode (LD). The device includes a bottom n-type layer; a top n-type layer, and an undoped or n-type doped middle layer inserted between the top layer and bottom layer. The middle layer includes at least one other material creating two or more heterojunctions and where the top or bottom layers create light emission by interband tunneling-induced photon emission (TIPE). The (TIPE) is a second-order quantum-mechanical transition. Additionally, the interband tunneling creates a hole on the same side where electrons are accumulated optical emission occurs, and where the interband tunneling and the optical emission are coupled through the second-order quantum mechanical process.

In an embodiment, the unipolar n-type semiconductor LED or LD device is based upon TIPE where the top or bottom layers support the generation of holes by interband tunneling such that the holes transfer to the opposite side where electrons are accumulated and radiatively recombine with the holes at or near the band-gap wavelength of the semiconductor.

In an embodiment, the LED or LD devices are operated at room temperature. The middle layer forms at least two intraband electron tunnel barriers, and the at least two intraband tunnel barriers form a quantum well between them. The at least two intraband tunnel barriers and the quantum well are configured to act as a resonant tunneling diode (RTD).

In an embodiment, the top, middle and bottom layers include In$_X$Ga$_{1-X}$As and In$_Y$Al$_{1-Y}$As, or combinations thereof, and the In$_X$Ga$_{1-X}$As layers conduct free electrons and holes. The In$_Y$Al$_{1-Y}$As layers act as barriers to electrons and holes, while all layers are designed to promote the generation of holes by interband tunneling of electrons in certain regions of the device. The layers create electron-hole radiative recombination in an electron-rich region by emission at or near the band-gap wavelength in the short-wave infrared (SWIR) region of the spectrum between 1.0 and 2.5 micron wavelength.

In an embodiment, a in which X≈0.53 and Y≈0.0. Thus, creating an In$_{0.53}$Ga$_{0.47}$As/AlAs heterostructure with pseudomorphically strained tunnel barriers and emission of light in the SWIR region around 1.6 micron wavelength.

In an embodiment, a device in which X≈0.53 and Y≈0.52. Thus, creating a In$_{0.53}$Ga$_{0.47}$As/In$_{0.52}$Al$_{0.48}$As heterostructure with lattice-matched tunnel barriers and emission of light in the SWIR region about 1.5 micron wavelength.

In an embodiment, a device in which X≈1.0 and Y≈0.0, creating an InAs/AlAs heterostructure with pseudomorphically-strained tunnel barriers and emission of light in the MWIR region around 3.5 micron wavelength.

In an embodiment, the device is grown lattice-matched on InP substrates, or lattice mismatched on GaAs or Si substrates.

In an embodiment, the device is grown lattice-matched on InAs substrates, or lattice mismatched on InP, GaAs or Si substrates.

In an embodiment, the top, middle and bottom layers of a device include In$_X$Ga$_{1-X}$Sb and In$_Y$Al$_{1-Y}$Sb, or combinations thereof. The In$_X$Ga$_{1-X}$Sb layers conduct free electrons and holes, and the In$_Y$Al$_{1-Y}$Sb layers act as barriers to electrons and holes. All layers are designed to promote the generation of holes by interband tunneling of electrons in certain regions of the device, and create electron-hole radiative recombination in an electron-rich region by emission at or near the band-gap wavelength in the mid-wave infrared (MWIR) region of the spectrum between 3.0 and 5.0 micron wavelength.

In an embodiment, a device in which X≈1.0 and Y≈0.0, creating a InSb/AlSb heterostructure with lattice-mismatched tunnel barriers and emission of light in the MWIR region around 7.3 micron wavelength.

In an embodiment, a device grown lattice-matched on InSb substrates, or lattice mismatched on InAs, InP, GaAs or Si substrates.

In an embodiment, a device in which the top, middle and bottom layers are comprised of Hg$_X$Cd$_{1-X}$Te and Hg$_Y$Cd$_{1-Y}$Te, or combinations thereof, with X>>Y and where the $Hg_XCd_{1-X}Te$ layers conduct free electrons and holes, and the $Hg_YCd_{1-Y}Te$ layers act as barriers to electrons and holes, all layers being designed to promote the generation of holes by interband tunneling of electrons in certain regions of the device, and create electron-hole radiative recombination in an electron-rich region by emission at or near the band-gap wavelength in the long-wave infrared (LWIR) region of the spectrum between 8.0 and 12.0 micron wavelength.

In an embodiment, a device in which X≈0.8 and Y≈0.0, creating a $Hg_{0.83}Cd_{0.17}Te/CdTe$ heterostructure with pseudomorphically strained tunnel barriers and emission of light in the LWIR region around 11.0 micron wavelength.

In an embodiment, a device grown lattice-matched on CdZnTe substrates, or lattice mismatched on GaAs or Si substrates.

In an embodiment, a device for which the electrical speed or modulation bandwidth is much greater than those of analogous light emitting devices made from conventional p-n diodes because of a much lower capacitance: built-in (junction) capacitance, diffusion capacitance, or both.

In an embodiment, an optical clock with very low jitter (□ 100 fs) comprising a RTD-LED or RTD-LD emitter and a radio-frequency transmission-line relaxation oscillator driven by the switching action of the RTD through its inherent negative resistance. The RTD structure is shared by both the emitter and the relaxation oscillator.

In an embodiment, a device configured as a mode-locked laser using an RTD-LD device embedded in an optical cavity. The RTD relaxation oscillator serves to synchronize the optical gain of the RTD-LD device with respect to the longitudinal modes of the optical cavity.

In an embodiment, an n-type, unipolar-doped, interband-tunneling LED configured as a target illuminator for infrared imaging systems with the LED designed for high output power through the fabrication of multiple such LEDs on the same substrate and sharing the same device design by the technique commonly known as monolithic integration. The device may have an internal quantum efficiency as high as 0.5 by optimizing the parameters of the LED device structure such as electric field of Zener tunneling, doping density, barrier and well thicknesses, and depletion length.

In an embodiment, an n-type, unipolar-doped, interband-tunneling LD as an optical transmitter for an infrared light detection and ranging (lidar) system. The LD being designed for high output power using the cleaved-end-facet approach and confinement of the spatial mode by "stripe" mesa isolation to enable single-wavelength, high-power operation with good beam quality and light emission stability. Additionally, a unipolar RTD-LD can produce short pulses by sharing the same RTD with a radio-frequency transmission-line relaxation oscillator driven by the self-oscillation of the RTD through its inherent negative resistance (NDR).

In an embodiment, a RTD device which is the "gain medium" for the two mutual mode-locked processes, one optical and one electrical, and where voltage pluses created by the RTD relaxation oscillation can serve as a "shutter" for active optical mode locking. This forces the modes of the RTD-LD in the optical cavity into the same phase to get the laser emission; and where the annihilation of electrons and holes by the optical transition of RTD-LD attenuates the amplitude of voltage pulses from the RTD relaxation oscillator. This forces all the possible RF harmonics in the transmission-line resonator to be share the same phase.

What is claimed:

1. A unipolar-doped light emitting diode or laser diode, comprising:
    a bottom region having an n-type layer, a top region having an n-type layer, and a middle region between the top and bottom regions having at least one material different from the top or bottom region forming two or more heterojunctions; wherein the top or bottom regions create light emission by interband tunneling-induced photon emission; and wherein the interband tunneling creates a hole on the same side of the heterojunction as electrons are accumulated generating optical emission.

2. The device of claim 1, wherein the interband tunneling and the optical emission are coupled through a second-order quantum mechanical process.

3. The device of claim 1, wherein the middle layer forms at least two intraband electron tunnel barriers, wherein the at least two intraband tunnel barriers form a quantum well between them, wherein the at least two intraband tunnel barriers and the quantum well are configured to act as a resonant tunneling diode.

4. The device of claim 3, wherein the device is configured to operate at room-temperature.

5. The device of claim 3, wherein the top, middle and bottom layers are comprised of $In_XGa_{1-X}As$ and $In_YAl_{1-Y}As$, or combinations thereof, and wherein the $In_XGa_{1-X}As$ layers conduct free electrons and holes, and the $In_YAl_{1-Y}As$ layers act as barriers to electrons and holes.

6. The device of claim 3, wherein the device emits short-wavelength infrared light having a wavelength between 1.0 and 2.5 microns.

7. The device of claim 5, wherein X=0.53 and Y=0.0, creating an $In_{0.53}Ga_{0.47}As/AlAs$ heterostructure with pseudomorphically strained tunnel barriers.

8. A unipolar-doped light emitting diode or laser diode, comprising:
    a bottom region having an n-type layer, a top region having an n-type layer, and a middle region between the top and bottom regions having at least one material different from the top or bottom region forming two or more heterojunctions; and where the top or bottom regions create light emission by interband tunneling-induced photon emission, wherein the interband tunneling creates a hole on the opposed side of the heterojunction as electrons are accumulated, and wherein the holes tunnel through at least one heterojunction and at least one hole recombines with at least one election generating optical emission.

9. The device of claim 8, wherein the top, middle and bottom layers are comprised of $In_XGa_{1-X}Sb$ and $In_YAl_{1-Y}Sb$, or combinations thereof, and wherein the $In_XGa_{1-X}Sb$ layers conduct free electrons and holes, and the $In_YAl_{1-Y}Sb$ layers act as barriers to electrons and holes.

10. The device of claim 8, wherein the top, middle and bottom layers are comprised of $In_XGa_{1-X}As$ and $In_YAl_{1-Y}As$, or combinations thereof, and wherein the $In_XGa_{1-X}As$ layers conduct free electrons and holes, and the $In_YAl_{1-Y}As$ layers act as barriers to electrons and holes.

11. The device of claim 8, wherein the device emits short-wavelength infrared light having a wavelength between 3.0 and 5.0 microns.

12. The device of claim 8, wherein the top, middle and bottom layers comprise $Hg_XCd_{1-X}Te$ and $Hg_YCd_{1-Y}Te$, or combinations thereof, with X>>Y and wherein the $Hg_XCd_{1-X}Te$ layers conduct free electrons and holes, and the $Hg_YCd_{1-Y}Te$ layers act as barriers to electrons and holes.

13. An optical clock exhibiting a jitter of less than about 100 femtoseconds comprising, the device of claim 3 and a radio-frequency transmission-line relaxation oscillator driven by the device of claim 3.

14. The device of claim 13, wherein the device is configured as a mode-locked laser using the device of claim 3 embedded in an optical cavity, whereby the RTD relaxation oscillator serves to synchronize an optical gain of the device with respect to the longitudinal modes of an optical cavity.

15. An infrared imaging system comprising the device of claim 8.

16. The system of claim 15, wherein system includes a plurality of the devices of claim 8.

17. The system of claim 16, wherein the plurality of devices are monolithically integrated.

18. The system of claim 17, wherein at least one of the plurality of devices exhibits an internal quantum efficiency of at least 0.5.

19. The system of claim 15, wherein the system is configured for infrared light detection and ranging.

* * * * *